United States Patent
Ohsawa

(10) Patent No.: US 8,076,822 B2
(45) Date of Patent: Dec. 13, 2011

(54) PIEZOELECTRIC ELEMENT DRIVE DEVICE, ELECTRONIC APPARATUS, AND METHOD FOR CONTROLLING PIEZOELECTRIC ELEMENT DRIVE FREQUENCY

(75) Inventor: Takao Ohsawa, Tokyo (JP)

(73) Assignee: Sony Corporation (JP)

( * ) Notice: Subject to any disclaimer, the term of this patent is extended or adjusted under 35 U.S.C. 154(b) by 324 days.

(21) Appl. No.: 12/383,427

(22) Filed: Mar. 24, 2009

(65) Prior Publication Data

US 2009/0243431 A1    Oct. 1, 2009

(30) Foreign Application Priority Data

Mar. 26, 2008  (JP) ................ P2008-080273

(51) Int. Cl.
*H01L 41/09* (2006.01)
(52) U.S. Cl. ...................................................... 310/317
(58) Field of Classification Search ............ 310/317
See application file for complete search history.

(56) References Cited

U.S. PATENT DOCUMENTS

| | | | |
|---|---|---|---|
| 4,939,402 A | | 7/1990 | Hirayama et al. |
| 4,965,532 A | * | 10/1990 | Sakurai .............................. 331/4 |
| 2002/0161385 A1 | * | 10/2002 | Wiener et al. .................. 606/169 |
| 2005/0067921 A1 | * | 3/2005 | Yamamoto ..................... 310/317 |

FOREIGN PATENT DOCUMENTS

| | | |
|---|---|---|
| JP | 64-008876 U | 1/1989 |
| JP | 2618685 B2 | 3/1997 |
| JP | 10136668 A | 5/1998 |
| JP | 2976489 B2 | 9/1999 |
| JP | 3115618 B2 | 9/2000 |
| JP | 2001-286162 A | 10/2001 |
| JP | 2007-215390 A | 8/2007 |
| JP | 2007336752 A | 12/2007 |

OTHER PUBLICATIONS

Office Action from Japanese Application No. 2008-080273, dated Jul. 27, 2010.

* cited by examiner

*Primary Examiner* — Derek Rosenau
(74) *Attorney, Agent, or Firm* — Lerner, David, Littenberg, Krumholz & Mentlik, LLP

(57) ABSTRACT

A drive device for a piezoelectric element includes a transformer, a driver circuit, and a control circuit. The transformer has a primary side and a secondary side. The drive circuit causes the secondary side to generate a drive signal whose frequency varies in accordance with a control signal input to the primary side and to supply the generated drive signal to the piezoelectric element. The control circuit changes a frequency of the control signal in a predetermined frequency range multiple times, detects an impedance change in the piezoelectric element each time the control-signal frequency is changed, determines a resonant frequency of the piezoelectric element on the basis of a transition of the impedance change, and controls the control-signal frequency so that the determined resonant frequency is obtained.

4 Claims, 14 Drawing Sheets

FIG. 15

| | RECORDING MODE | PLAYBACK MODE |
|---|---|---|
| AIRFLOW-VOLUME MODE 1 | FIXED AIRFLOW VOLUME | TEMPERATURE DEPENDENCY |
| AIRFLOW-VOLUME MODE 2 | FIXED AIRFLOW VOLUME | FIXED AIRFLOW VOLUME |
| AIRFLOW-VOLUME MODE 3 | TEMPERATURE DEPENDENCY | TEMPERATURE DEPENDENCY |
| AIRFLOW-VOLUME MODE 4 | TEMPERATURE DEPENDENCY | FIXED AIRFLOW VOLUME |

PIEZOELECTRIC ELEMENT DRIVE DEVICE, ELECTRONIC APPARATUS, AND METHOD FOR CONTROLLING PIEZOELECTRIC ELEMENT DRIVE FREQUENCY

CROSS REFERENCES TO RELATED APPLICATIONS

The present application claims priority from Japanese Patent Application No. JP 2008-080273, filed in the Japanese Patent Office on Mar. 26, 2008, the entire content of which is incorporated herein by reference.

BACKGROUND OF THE INVENTION

1. Field of the Invention

The present invention relates to a piezoelectric-element drive device that can change a drive frequency, an electronic apparatus having a fluid pump using a piezoelectric element, and a method for controlling the driving frequency of a piezoelectric element.

2. Description of the Related Art

Piezoelectric-element drive circuits that are preferably used for liquid sprayers and various types of actuator have been proposed (e.g., refer to Japanese Patent Nos. 2618685 and 3115618.

In such a drive circuit, a transistor for switching is connected to a primary winding of a transformer and a piezoelectric element is connected to a secondary winding thereof. The drive circuit generates and controls a drive voltage for the piezoelectric element by performing a switching operation of the transistor.

As a drive circuit for a supersonic motor using a piezoelectric element, a drive circuit having a resonant frequency that resonates in parallel with the piezoelectric element is in order to generate a sinusoidal drive voltage at the secondary side even when switching using a transistor or the like is performed at the primary side has been proposed (e.g., refer to Japanese Patent No. 2976489.

Japanese Patent Nos. 2618685, 3115618, and 2976489 disclose technologies in which a resonant circuit including a piezoelectric element is formed at the secondary side of the transformer and the piezoelectric element is driven in the vicinity of the resonant frequency of the resonant circuit.

The driving in the vicinity of the resonant frequency is preferable because of high efficiency and low-power consumption.

The piezoelectric element (piezoelectric vibrator), however, has a resonant point that varies depending on a temperature or the like, for example, as disclosed in Japanese Patent No. 2618685, and thus typically involves adjusting the resonant point in accordance with variations in the temperature or the like.

Accordingly, in Japanese Patent Nos. 2618685 and 3115618, phase comparison of a voltage and a current at the secondary side of the transformer is performed to control a drive frequency corresponding to changes in the resonant point.

SUMMARY OF THE INVENTION

However, the drive frequency control using phase comparison typically involves a large circuit scale for the phase comparison, which leads to an increase in cost.

It is thus desirable to provide a piezoelectric-element drive device that is capable of reliably driving, even with a small circuit scale, a piezoelectric element at a resonant frequency and with practically sufficient accuracy. It is also desirable to provide an electronic apparatus that utilizes the piezoelectric-element driving to drive a fluid pump. It is further desirable to provide a method for controlling the frequency of piezoelectric-element driving that can be performed with practically sufficient accuracy, even with a simple operation procedure.

According to one embodiment (a first embodiment) of the present invention, there is provided a drive device for a piezoelectric element. The drive device includes: a transformer having a primary side and a secondary side; a drive circuit configured to cause the secondary side to generate a drive signal whose frequency varies in accordance with a control signal input to the primary side and to supply the generated drive signal to the piezoelectric element; and a control circuit configured to change a frequency of the control signal in a predetermined frequency range multiple times, detect an impedance change in the piezoelectric element each time the control-signal frequency is changed, determine a resonant frequency of the piezoelectric element on the basis of a transition of the impedance change, and control the control-signal frequency so that the determined resonant frequency is obtained.

According to another embodiment (a second embodiment) of the present invention, when a difference between a maximum value and a minimum value of detection values obtained by changing the control-signal frequency in the predetermined frequency range multiple times is larger than or equal to a predetermined reference value, the control circuit may determine the resonant frequency of the piezoelectric element on the basis of a transition of the detection values, and when the difference is smaller than the reference value, the control circuit may invalidate the detection values.

According to another embodiment (a third embodiment) of the present invention, when the difference is larger than or equal to the reference value and the minimum value is larger than or equal to a predetermined threshold, the control circuit may estimate that the control-signal frequency at which the minimum value is obtained is the resonant frequency.

According to another embodiment (a fourth embodiment) of the present invention, when the difference is larger than or equal to the reference value and the minimum value is smaller than the predetermined threshold, the control circuit may obtain a trace of the detection values by connecting adjacent ones of the detection values with a straight line or an approximation curve. When the number of intersections at which the trace intersects a straight line indicating a constant level of the threshold is two, the control circuit may estimate that an average value of two frequencies corresponding to the two intersections is the resonant frequency, and when the number of intersections is three or more, the control circuit may estimate that an average value of a lowest one and a second lowest one of three or more frequencies corresponding to the respective three or more intersections is the resonant frequency.

According to another embodiment (a fifth embodiment) of the present invention, when the difference is larger than or equal to the reference value and multiple minimum values exist, the control circuit may estimate that a lowest one of frequencies corresponding to the respective minimum values is the resonant frequency.

According to another embodiment (a sixth embodiment) of the present invention, the control circuit may estimate that the control-signal frequency at which a minimum value of detection values obtained by changing the control-signal frequency in the predetermined frequency range multiple times is obtained is the resonant frequency.

According to another embodiment (a seventh embodiment) of the present invention, when multiple minimum values exist, the control circuit may estimate that a smallest one of frequencies corresponding to the respective minimum values is the resonant frequency.

According to another embodiment (an eighth embodiment) of the present invention, when a minimum value of detection values obtained by changing the control-signal frequency in the predetermined frequency range multiple times is smaller than a predetermined threshold, the control circuit may obtain a trace of the detection values by connecting adjacent ones of the detection values with a straight line or an approximation curve. When the number of intersections at which the trace intersects a straight line indicating a constant level of the threshold is two, the control circuit may estimate that an average value of two frequencies corresponding to the two intersections is the resonant frequency, and when the number of intersections is three or more, the control circuit may estimate that an average value of a lowest one and a second lowest one of three or more frequencies corresponding to the respective three or more intersections is the resonant frequency.

According to another embodiment (a ninth embodiment) of the present invention, when the detection values are invalidated, the control circuit may detect the impedance change again by changing the frequency range, and may repeat the change of frequency range and the detection of the impedance change until detection values at which the difference between the maximum value and the minimum value thereof is larger than or equal to the predetermined reference value are obtained.

According to another embodiment (a tenth embodiment) of the present invention, a frequency band in which the frequency range is selectable may be predetermined. When the frequency range is changed to select all frequencies contained in the frequency band and the detection of the impedance change therein is completed, the control circuit may suspend driving of the piezoelectric element and may output an instruction for abnormality warning.

According to another embodiment (an eleventh embodiment) of the present invention, the control circuit may determine the resonant frequency by changing the control-signal frequency in the predetermined frequency range multiple times, and may repeat an operation for controlling the control-signal frequency each time a predetermined time passes so that the determined resonant frequency is obtained.

According to another embodiment (a twelfth embodiment) of the present invention, the drive device may further include a temperature detection element configured to detect a temperature. In accordance with the detected temperature, the control circuit may change the predetermined time for repeating the operation for controlling the control-signal frequency.

According to another embodiment (a thirteenth embodiment) of the present invention, the control circuit may detect a change in a voltage level of the drive signal, the voltage level having a value corresponding to an impedance of the piezoelectric element when an amplitude of the control signal is constant.

According to another embodiment (a fourteenth embodiment) of the present invention, there is provided an electronic apparatus. The electronic apparatus includes: a pump including a piezoelectric element having a piezoelectric member, a pump chamber having a face covered with either the piezoelectric member or a vibrating member that vibrates in conjunction with the piezoelectric member, and an inlet port and an outlet port configured to communicate with the pump chamber, fluid being suctioned through the inlet port and the fluid being discharged through the outlet port; a transformer having a primary side and a secondary side, the piezoelectric element being connected to the secondary side; a drive circuit configured to cause the secondary side to generate a drive signal having a frequency that varies in accordance with a control signal input to the primary side and to supply the generated drive signal to the piezoelectric element; and a control circuit configured to change a frequency of the control signal in a predetermined frequency range multiple times, detect an impedance change in the piezoelectric element each time the control-signal frequency is changed, determine a resonant frequency of the piezoelectric element on the basis of a transition of the impedance change, and control the control-signal frequency so that the determined resonant frequency is obtained.

According to another embodiment (a fifteenth embodiment) of the present invention, there is provided a method including below steps for controlling a frequency of a drive signal for driving a piezoelectric element included in a resonant circuit so that the drive-signal frequency substantially matches a resonant frequency of the resonant circuit. The method include the steps of: changing the drive-signal frequency in a predetermined frequency range multiple times; detecting an impedance change in the piezoelectric element each time the drive-signal frequency is changed; determining the resonant frequency on the basis of a transition of values of the detection; and determining the drive-signal frequency so that the determined resonant frequency is obtained.

According to another embodiment (a sixteenth embodiment) of the present invention, in the resonant-frequency determining step, a difference between a maximum value and a minimum value of the detection values is determined and is compared with a predetermined reference value, and when the comparison shows that the difference is larger than or equal to the predetermined reference value, the resonant frequency of the piezoelectric element may be determined on the basis of the transition of the detection values, and when the comparison shows that the difference is smaller than the predetermined reference value, the detection values may be invalidated.

According to another embodiment (a seventeenth embodiment) of the present invention, in the resonant frequency determining step, the drive-signal frequency at which a minimum value of the detection values obtained by changing the drive-signal frequency in the predetermined frequency range multiple times is obtained may be estimated to be the resonant frequency.

According to another embodiment (an eighteenth embodiment) of the present invention, in the resonant-frequency determining step, when a minimum value of the detection values obtained by changing the drive-signal frequency in the predetermined frequency range multiple times is smaller than a predetermined threshold, a trace of the detection values may be obtained by connecting adjacent ones of the detection values with a straight line or an approximation curve. When the number of intersections at which the trace intersects a straight line indicating a constant level of the threshold is two, an average value of two frequencies corresponding to the two intersections may be estimated to be the resonant frequency, and when the number of intersections is three or more, an average value of a lowest one and a second lowest one of three or more frequencies corresponding to the respective three or more intersections may be estimated to be the resonant frequency.

According to another embodiment (a nineteenth embodiment) of the present invention, during the change of the drive-signal frequency, the drive signal whose frequency and amplitude vary in accordance with a control signal when the control signal is supplied to a primary side of a transformer may be supplied to the piezoelectric element connected to a secondary side of the transformer, and the drive-signal frequency may be changed via the control signal. A change in a voltage level of the drive signal, the voltage level having a value corresponding to an impedance of the piezoelectric element when an amplitude of the control signal is constant, may be detected.

With the drive device, when the control signal is input to the primary side of the transformer, the drive signal whose frequency varies in accordance with the control signal is generated at the secondary side of the transformer. The piezoelectric element is connected to the secondary side of the transformer and a resonant circuit including the piezoelectric element is provided. When the resonant frequency of the resonant circuit and the drive-signal frequency substantially match each other, the resonant frequency operates at high efficiency.

Thus, the control circuit controls the control-signal frequency in a manner described below so that the resonant frequency can be obtained according to the drive signal for the secondary side of the transformer.

According to the present invention, the predetermined frequency range is determined as a change range for the control-signal frequency, and the control circuit changes the control-signal frequency in the range. For example, a pitch of the frequency to be changed is arbitrary. The predetermined frequency range can also be changed (refer to the ninth embodiment).

The control circuit detects an impedance change in the piezoelectric element each time the control-signal frequency is changed in the above-described range. The control circuit determines the resonant frequency of the piezoelectric element on the basis of the impedance change. The control circuit then controls the control-signal frequency so that the determined resonant frequency is obtained.

For example, as described in the thirteenth embodiment, the impedance change in the piezoelectric element can be detected from the change in the voltage level of the drive signal. That is, when the frequency is changed with the amplitude of the control signal being constant, the voltage level of the drive signal changes and this change indicates the impedance change of the piezoelectric element. For example, even when input power given by the control signal is the same, the voltage level of the drive voltage reaches its maximum when the impedance of the piezoelectric element is minimum, and the largest amount of drive current flows through the piezoelectric element. Thus, a point at which the impedance of the piezoelectric element is minimum can be identified based on the voltage level of the drive voltage, and when the impedance is minimum, the piezoelectric element is driven in the vicinity of the resonant frequency.

Changing the control-signal frequency in a very small frequency pitch with respect to the predetermined frequency range makes it possible to detect a frequency that substantially matches the resonant frequency. However, depending on the size of the frequency range, it may take more time according to a decrease in the frequency pitch. Thus, in the second and subsequent embodiments of the present invention, the resonant frequency is estimated by the following simple method.

In the second embodiment, first, whether or not the set frequency range is appropriate is determined on the basis of the difference between the maximum value and the minimum value of the detection values. Since changes in the detection values in the vicinity of the resonant frequency are significant, the difference has a relatively large value when the frequency range including the resonant frequency is set. Thus, the reference value is set for a value that is appropriate to check whether or not the frequency range includes the resonant frequency. When the difference is larger than or equal to the reference value, it is determined that the frequency range is appropriate, and when the difference is smaller than the reference value, it is determined that the frequency range is inappropriate and the detection values are invalidated.

When the difference in the presently set frequency range is smaller than the reference value and the present detection values are invalidated, the frequency range may be changed again to detect the impedance change (refer to the ninth embodiment). In the ninth embodiment, the change of the frequency range and the detection of the impedance change are repeated until multiple detection values at which the difference between the maximum value and the minimum value thereof is larger than or equal to the predetermined reference value are obtained.

In this case, as in the tenth embodiment, the frequency band in which the frequency range is selectable may be predetermined. When no more selectable frequency range is available, a failure may be occurring. Thus, the control circuit may suspend the driving and may output an instruction for abnormality warning.

In a first frequency estimation scheme, in the case (in the third embodiment) in which the frequency-range appropriateness/inappropriateness determination in the second embodiment shows that the difference is larger than or equal to the reference value (i.e., the range is appropriate) or in the case (in the sixth embodiment) that does not involve the determination in the second embodiment, the control-signal frequency at which the minimum value of the obtained detection values is obtained is estimated to be the resonant frequency. The third embodiment employs the scheme when the minimum value is larger than or equal to the predetermined threshold.

For example, in general, a detection value at a resonant frequency is smaller than or equal to a certain value, and thus, the threshold can be used as such a rough indication. Even when all detection values are larger than the threshold because of rough detection points, a frequency in the vicinity of the minimum detection value can be estimated to close to the resonant frequency, and therefore, in the third embodiment, the minimum detection value is used to estimate the resonant frequency. As in the sixth embodiment, however, the resonant frequency may be estimated using the minimum value without using the threshold.

In the first frequency estimation scheme, when multiple minimum values having the same value exist, the lowest one of the frequencies corresponding to the respective minimum values can be estimated to be the resonant frequency (in the seventh embodiment).

When multiple minimum values exist, to which of the minimum values the resonant frequency is the closest is generally unknown. The more the frequency decreases, the more power consumed during the generation of the control signal decreases, and when the drive frequency of the piezoelectric element is displaced from the resonant point, as long as the amount of displacement is the same, a smaller frequency is advantageous in terms of power consumed mainly by the piezoelectric element. Even though whether the frequency in question is the closest to the resonant frequency is unknown, considering that, at least, power consumption is lower for a lower frequency when the amount of displacement to the resonant frequency is the same, the seventh embodiment is intended to select a frequency at which power consumption is more likely to be low.

In a second frequency estimation scheme, in the case (in the fourth embodiment) in which the frequency-range appropriateness/inappropriateness determination in the second embodiment shows that the difference is larger than or equal to the reference value (i.e., the range is appropriate) and the minimum value is smaller than the threshold or in the case (in the eighth embodiment) in which the comparison with the threshold shows that the minimum value is smaller than the threshold without the determination in the second embodiment, the resonant frequency is estimated as follows in accordance with the number of points at which the detection values are the same as the threshold.

In this case, for example, when the detection points are rough, it is difficult to determine whether or not the detection values are the same as the threshold value. Thus, a trace of the detection values are obtained by connecting the detection values with a straight line or an approximation curve. Then, intersections at which the trace intersects a straight line indicating the constant level of the threshold are determined. When the minimum value of the detection values is smaller than the threshold, two or more intersections exist. When the number of intersections is two, the average value of two frequencies corresponding to the two intersections is estimated to be the resonant frequency. In addition, when the number of intersections is three or more, the average value of the lowest one and the second lowest one of three or more frequencies corresponding to the respective three or more intersections is estimated to be the resonant frequency. The reason why the frequencies at the lowest frequency side are selected is analogous to that in the seventh embodiment.

The resonant frequency has a characteristic of shifting with time, and thus, in the eleventh embodiment, determination of the resonant frequency and control-signal frequency control based on the determined resonant frequency are performed each time a predetermined time passes.

In the twelfth embodiment, a temperature detection element is provided and the predetermined time is changed in accordance with a temperature. For example, the more the temperature increases, the more the predetermined time may be reduced so that the frequency control corresponding to the resonant frequency may be frequently performed.

According to the present invention, it is possible to provide a piezoelectric-element drive device that is capable of reliably driving, even with a small circuit scale, a piezoelectric element at a resonant frequency with practically sufficient accuracy. It is also possible to provide an electronic apparatus that utilizes the piezoelectric-element driving to drive a fluid pump. It is further possible to provide a method for controlling the frequency of piezoelectric-element driving that can be performed with practically sufficient accuracy, even with a simple operation procedure.

BRIEF DESCRIPTION OF THE DRAWINGS

FIG. 15 is a table specifying relationships of an airflow-volume mode, a recording mode, and a playback mode according to a fourth embodiment of the present invention.

DESCRIPTION OF THE PREFERRED EMBODIMENTS

Embodiments of the present invention will be described below with reference to the accompanying drawings.

First Embodiment

A first embodiment of the present invention is directed to a drive device for a piezoelectric element.
<Device Configuration>

Figure 1:
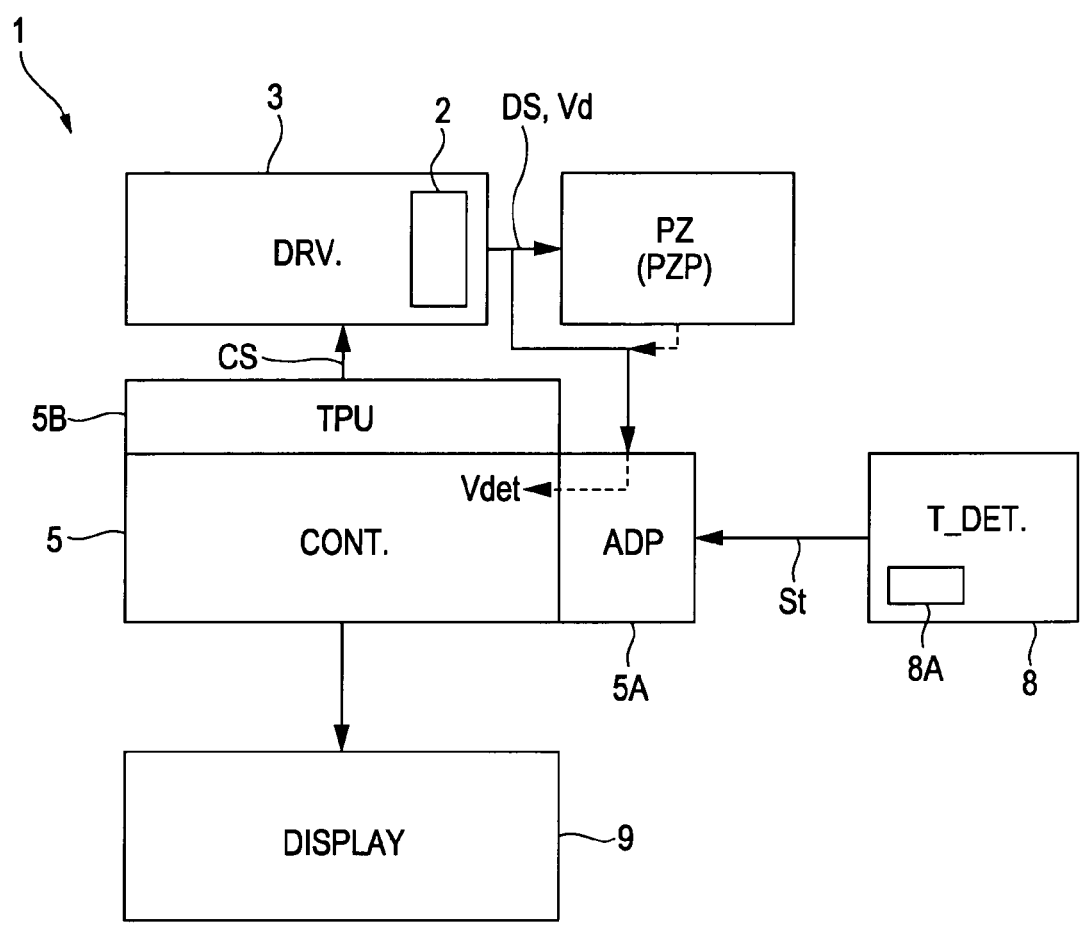
FIG. 1 is a circuit block diagram showing the configuration of a drive circuit according to an embodiment of the present invention.

FIG. 1 is a bock diagram of a drive device for a piezoelectric element PZ.

A drive device 1 illustrated in FIG. 1 includes an electromagnetic coupling transformer 2, a drive circuit (DRV.) 3, a controller (CONT.) 5, a temperature detection circuit (T_DET.) 8, and a display 9. The controller 5 includes a microcomputer or the like to serve as a control circuit.

In the drive device 1, the electromagnetic coupling transformer 2, the drive circuit 3, and the controller 5 are main components for driving the piezoelectric element PZ, and the temperature detection circuit 8 and the display 9 are optional.

In FIG. 1, the controller 5 has an analog-to-digital conversion port (shown as "ADP" and hereinafter referred to as an "AD port") 5A and a timer pulse unit (TPU) 5B for controlling, for example, generation and stopping of a control signal CS having a predetermined duty ratio and having a predetermined frequency. The timer pulse unit 5B is configured so that it can control the duty ratio and the frequency (cycle) of the control signal CS to be output and also can control stopping of the control signal CS in accordance with an instruction externally input to the controller 5 or in accordance with a determination made by the controller 5.

FIG. 1 shows an example of a configuration that can control stopping of the control signal CS and can control the frequency thereof in accordance with a detection temperature input from the temperature detection circuit 8.

The timer pulse unit 5B may be realized by hardware or may be realized by software defined by a program for controlling the controller 5.

When the timer pulse unit 5B is realized by hardware, it may include, for example, a binary up counter, a comparator, or a register. When the timer pulse unit 5B is realized by software, the controller 5 may be implemented by a computer-based IC device (such as a DSP [digital signal processor]) to be executed and controlled by a program so as to function as the timer pulse unit 5B.

The electromagnetic coupling transformer 2 has a primary winding W1 and a secondary winding W2 (described below and shown in FIG. 2). The piezoelectric element PZ is connected to the secondary winding W2. The drive circuit 3 drives the primary winding W1 in accordance with the control signal CS and supplies a drive signal DS to the piezoelectric element PZ. The drive signal DS may also be referred to as a "drive voltage Vd" hereinafter. The drive signal DS is, for example, an alternating current (AC) signal with a frequency of several tens of kilohertz, depending on a drive frequency. The AC signal drives the piezoelectric element PZ.

In the configuration shown in FIG. 1, after the drive signal DS is converted into an analog direct current (DC) voltage via the AD port 5A, the level of the converted voltage is read as digital data.

Figure 2:
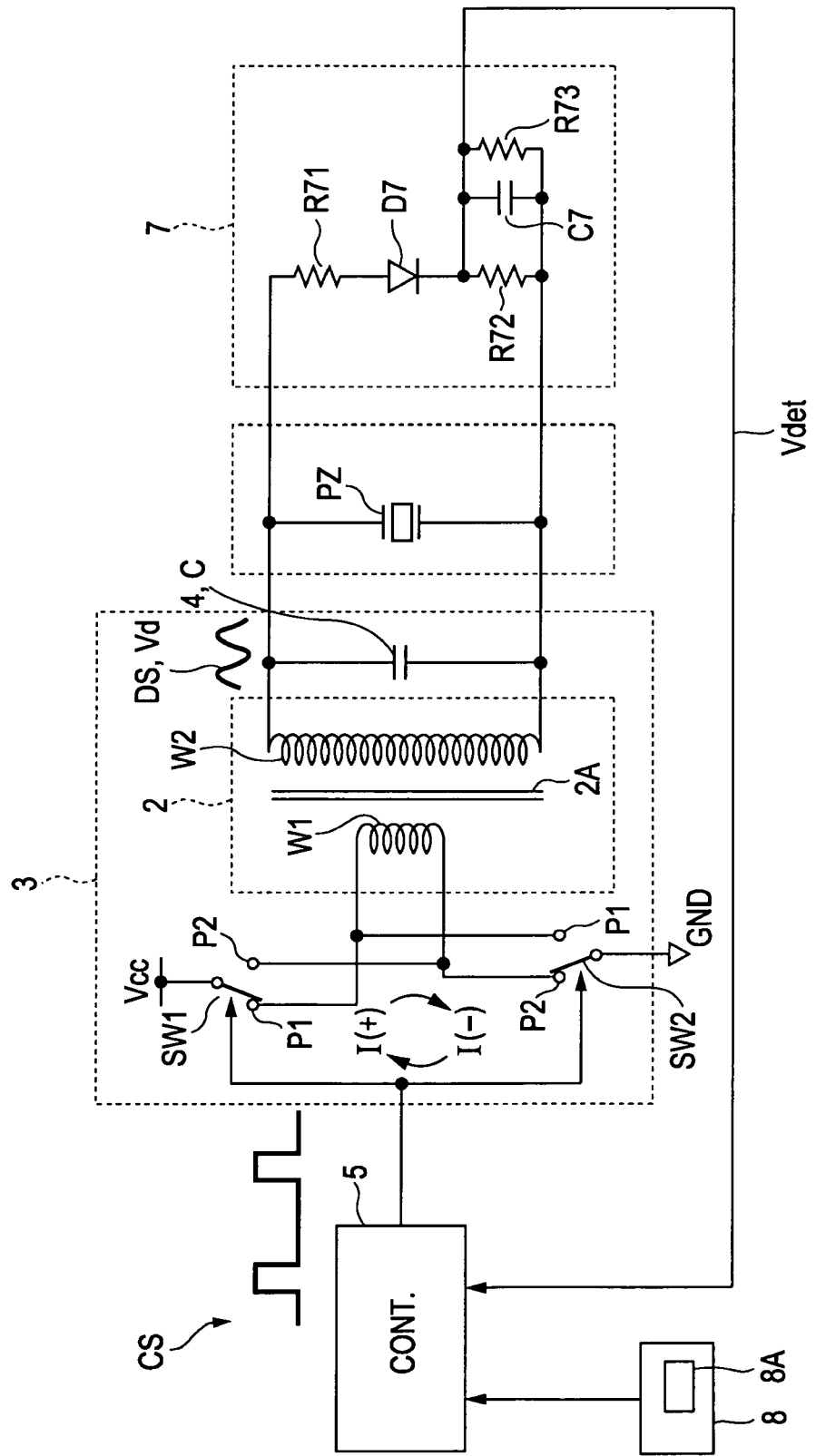
FIG. 2 is a circuit diagram showing an example of a more detailed configuration of an electromagnetic coupling transformer, the drive circuit, and so on according to the embodiment of the present invention.

FIG. 2 is a circuit diagram showing an example of a more detailed configuration of the electromagnetic coupling transformer 2, the drive circuit 3, and so on.

Each configuration will now be described with reference to FIGS. 1 and 2.

As shown in FIG. 2, the electromagnetic coupling transformer 2 has a magnetic member 2A, which is provided between the primary winding W1 and the secondary winding W2 to electrically and magnetically couple the primary winding W1 and the secondary winding W2. The magnetic member 2A has a relative magnetic permeability of 1 or more. The ratio of the number of turns of the primary winding W1 to the number of turns of the secondary winding W2 (i.e., the turns ratio) of the electromagnetic coupling transformer 2 is set to a predetermined value.

The drive circuit 3 is connected to the primary winding W1 of the electromagnetic coupling transformer 2 and the piezoelectric element PZ is connected to the secondary winding W2 of the electromagnetic coupling transformer 2.

The drive circuit 3 illustrated in FIG. 2 is a so-called "two-switch drive circuit".

That is, the illustrated drive circuit 3 has two switches SW1 and SW2, each of which is implemented by a transistor or the like. Each of the switches SW1 and SW2 switches an operation piece to either of two contacts. The operation piece of the switch SW1 is connected to a power-supply voltage Vcc and the operation piece of the switch SW2 is connected to a reference voltage, for example, a ground voltage GND, for the power-supply voltage.

Each of the switches SW1 and SW2 has a first contact P1 connected to one end of the primary winding W1 and a second contact P2 connected to another end of the primary winding W1, and differentially switches between the contacts P1 and P2. As shown in FIG. 2, when the operation piece of the switch SW1 is connected to the first contact P1 so that the power-supply voltage Vcc is supplied, the operation piece of the switch SW2 is connected to the second contact P2 so that the ground voltage GND is supplied. Conversely, when the operation piece of the switch SW1 is switched to the second contact P2 to put the operation into a state in which the ground voltage GND is supplied, the connection target of the operation piece of the switch SW2 is almost simultaneously switched to the first contact P1 so that the power-supply voltage Vcc is supplied.

When such a two-contact switch is realized by transistors, the drive circuit 3 may be configured with four transistors connected in the so-called H-bridge configuration. The H-bridge configuration can be realized, for example, by forming the switch SW1 with two PMOS transistors whose on and off states are differentially operated and forming the switch SW2 with two NMOS transistors that are differentially operated.

The switches SW1 and SW2 are controlled by the control signal CS that is output from the controller 5 and that has a predetermined duty ratio.

When a control pulse of the control signal CS is at a high level, the connection is in a state, for example, as shown in FIG. 2. Thus, only in a short period of time in which the control pulse is at a high level, current flows from the switch SW1 to the switch SW2 through the primary winding W1. This current is hereinafter referred to as "positive current I(+)". When the level of the control pulse goes low, both of the switches SW1 and SW2 are turned off and the primary winding W1 is put into a high impedance state.

Upon input of a next control pulse, the drive circuit 3 is put into a connection state that is opposite to that shown in FIG. 2 and the direction of the current flowing through the primary winding W1 is reversed. The current in this state is hereinafter referred to as "negative current I(−)". When the control pulse is turned off, both of the switches SW1 and SW2 are turned off and the primary winding W1 is put into a high impedance state.

The above-described operation is repeated to thereby cause the positive current I(+) and the negative current I(−) to alternately flow through the primary winding W1 in only predetermined short periods of time, respectively. This operation causes intermittent current drive that has a period of time in which no current flows between the period of time in which the positive current I(+) flows and the period of time in which the negative current I(−) flows.

When one control signal CS is used to drive the drive circuit 3, as shown in FIG. 2, a function for causing two switches SW1 and SW2 to operate alternately in response to an input pulse may be provided in the form of a circuitry in the drive circuit 3. When the function is provided in the form of a circuitry in the drive circuit 3, the scale of the drive circuit 3 increases and thus this approach is not so practical.

Accordingly, the timer pulse unit 5B in the controller 5 shown in FIG. 1 may generate two control signals having phases that are 180° different from each other to control the drive circuit 3 shown in FIG. 2.

In this case, the drive circuit 3 uses a first control signal (hereinafter denoted by CS1) to control positive current I(+) drive via the switches SW1 and SW2 and uses a second control signal (hereinafter denoted by CS2) to control negative current I(−) drive via the switches SW1 and SW2. With this arrangement, the drive circuit 3 can be configured with a simple circuit, and as described above, the primary winding W1 can be alternately and intermittently driven by the positive current I(+) and the negative current I(−).

With respect to the control signal CS generated by the timer pulse unit 5B shown in FIG. 1, the two-value pulse shown in FIG. 2 may be replaced with a three-value pulse having a positive pulse and a negative pulse that appear alternately and intermittently across an intermediate voltage level, such as a ground voltage GND level, to thereby drive the drive circuit 3.

In the example of the configuration shown in FIG. 2, the AC-DC conversion function of the AD port 5A shown in FIG. 1 is realized by a detection circuit 7 externally attached to the piezoelectric element PZ.

The detection circuit 7 in this example detects a drive voltage Vd that appears at the secondary winding W2 in the electromagnetic coupling transformer 2 and that is supplied to the piezoelectric element PZ.

The detection circuit 7 may have any circuit configuration and can be implemented by, for example, a simple half-wave rectifier circuit as shown in FIG. 2.

The detection circuit 7 shown in FIG. 2 includes three resistors R71 to R73, a diode D7, and a capacitor C7.

A series circuit of the resistor R71, the diode D7, and the resistor D72 is connected in parallel with the secondary winding W2 and the piezoelectric element PZ, and the capacitor C7 and the resistor R73 are connected in parallel with the resistor R72. An output (a detection potential Vdet) is extracted from the cathode of the diode D7.

When the anode potential of the diode D7 is higher than the cathode potential thereof to some degree, a forward current flows through the diode D7. Thus, during a period of time in which the forward current flows, the capacitor C7 is charged and the detection potential Vdet appears at the output. When the potential difference between the anode and the cathode begins to decrease, the capacitor C7 is very slowly discharged via the resistor R73 having a large resistance, so that the waveform of the detection potential Vdet is smoothed (i.e., becomes substantially constant). The smoothing is continued throughout the period of time in which the potential difference between the anode and the cathode decreases to stop the flow of the current in the diode D7 and further the potentials of the anode and the cathode are reversed to cause the diode D7 to be reversely biased. Next, when a period in which the anode potential is higher than the cathode potential to some degree is reached again, the charge of the capacitor C7 is resumed. This second and subsequent charges are performed to merely compensate for a small amount of potential drop due to discharging during the immediately preceding smoothing.

Thereafter, similarly, the smoothing and the charging of a small amount of electricity that is sufficient to compensate for a potential drop during the smoothing are repeated, so that a voltage having a substantially constant waveform that is close to a DC waveform is obtained as the detection potential Vdet. The size of the detection potential Vdet (the level of the DC voltage) is proportional to the amplitude of the drive voltage that appears in the secondary winding W2.

The detection potential Vdet obtained as described above is input to the controller 5 and is read at its internal AD port 5A as a digital value.

In the detection circuit 7 illustrated in FIG. 2, the voltage between one end and the other end of the secondary winding W2 is divided by resistors and a smoothing circuit, for example, the capacitor C7 and the resistor R73 is connected in parallel with the resistor R72. However, the voltage between one end of the secondary winding W2 and the reference voltage (e.g., the ground voltage GND) may be divided by resistors so that the smoothing circuit is provided in parallel with a resistor of the reference voltage side. In addition, various modifications, such as providing a resistor in series with the secondary winding W2 or connecting a resistor between the secondary winding W2 and the reference voltage, can be made to the circuit, as appropriate.

Since the temperature detection circuit 8 is an optional configuration in the first embodiment, details of the temperature detection circuit 8 will be described in a second embodiment that uses the temperature detection circuit 8.

The controller 5 has at least a first function for controlling the frequency (the drive frequency) of the drive voltage Vd, output from the electromagnetic coupling transformer 2, by controlling the frequency of the control signal CS. In addition, the controller 5 may have, as an option, a second function for controlling the amplitude of the drive voltage Vd, output from the electromagnetic coupling transformer 2, by controlling the duty ratio of the control signal CS.

Details of the first function are described below.

<Drive Voltage Control>

With the second function (the drive voltage control), upon receiving an external instruction for increasing (or reducing) driving power for the piezoelectric element PZ (or upon making a determination on the basis of a detection temperature or the like), the controller 5 varies the duty ratio of the control signal CS by an amount corresponding to the amount of control specified by the instruction. Since the detection circuit 7 is provided, the controller 5 can check whether or not a result of the varied duty ratio of the control signal CS is accurately reflected in the drive voltage Vd that appears in the secondary winding W2 of the electromagnetic coupling transformer 2. As a result of the checking, the controller 5 determines whether the duty ratio is insufficiently varied or excessively varied. Thus, on the basis of information of the determination, the controller 5 can finely adjust the duty ratio of the control signal CS in order to achieve a desired drive voltage Vd.

The drive voltage changes based on the duty ratio are described in conjunction with an operation described below.

<Resonant Frequency Change>

A configuration for changing a resonant frequency will now be described.

The drive circuit 3, which is controlled by the control signal CS, operates so as to repeatedly set an ON state, in which current flows through the primary winding W1 of the electromagnetic coupling transformer 2, and an OFF state, in which no current flows through the primary winding W1, for the primary winding W1 with a predetermined frequency defined by the input control signal CS. In this case, for example, the ON state corresponds to the high level of the control pulse and the OFF state corresponds to the low level of the control pulse.

Now, the frequency (cycle T) of the primary-side current drive of the electromagnetic coupling transformer 2 is defined as a "current drive frequency". The current drive frequency is set so that, desirably, it matches the resonant frequency of a resonant circuit (including the piezoelectric element PZ) formed at the secondary side of the electromagnetic coupling transformer 2. Even when the current drive frequency does not exactly match the resonant frequency, operation is possible. It is, however, desired that the waveform of the voltage applied to the piezoelectric element PZ has a sine wave to cause the current drive frequency to match the resonant frequency, in order to achieve efficient driving.

As a configuration for achieving the frequency match, a reactance element 4 is connected in parallel with the secondary winding W2 of the electromagnetic coupling transformer 2, as shown in FIG. 2.

When the above-described ON state and OFF state are repeated to intermittently perform current drive of the primary side of the electromagnetic coupling transformer 2, power consumed by the drive circuit 3 at the primary side is a time average of power consumed with short-duration pulse current and thus becomes relatively small.

Once pulse current is supplied to the primary side of the electromagnetic coupling transformer 2, the resonance phenomenon of the resonant circuit at the secondary side causes the AC voltage (the drive voltage Vd) to be applied to the piezoelectric element PZ. If the OFF state is left unchanged at this point, the AC voltage is attenuated gradually. This attenuation is caused by energy loss due to copper loss or the like in the resonant circuit (the winding circuit). In the present embodiment, desirably, only in a short period of time before the positive and negative peak values of the AC voltage applied to the piezoelectric element PZ at the secondary side of the electromagnetic coupling transformer 2 are attenuated, energy is replenished by the next pulse current from the primary side, and this operation is repeated cyclically. However, energy may be cyclically replenished in a short period of time after the AC voltage applied to the piezoelectric element PZ is attenuated to some degree.

In the present embodiment, a discharge channel (e.g., the GND line) from the resonant circuit to the outside is absent, and virtually, no electricity is discharged to the outside. The above-described compensation for the energy loss due to copper loss or the like in the resonant frequency is performed entirely from the primary side by a minimum amount.

The above-described configuration makes it possible to achieve a significantly efficient operation with low power consumption.

The piezoelectric element PZ has an equivalent capacitance value that is determined depending on the utilization thereof. Thus, there are cases in which it may be difficult to cause the current drive frequency to match or to become substantially equal to the resonant frequency of the resonant circuit by only changing the frequency (the current drive frequency) of the control signal CS generated by the controller 5.

In order to achieve driving in the vicinity of the resonant frequency, the reactance element 4 may be added to the resonant circuit so that the current drive frequency matches or becomes equal to the resonant frequency of each resonant circuit. The reactance element 4 is included in a resonant circuit that resonates at the (current) drive frequency in parallel with capacitance components of an equivalent circuit of the piezoelectric element PZ and inductance components of the electromagnetic coupling transformer 2.

The reactance element 4 may be added to the resonant circuit by connecting a capacitor in parallel with the piezoelectric element PZ, as shown in FIG. 2. Alternatively, an inductor may be connected in parallel or in series with the piezoelectric element PZ.

Depending on the size or the material of the piezoelectric element PZ and an equivalent-circuit constant value determined thereby, the driving in the vicinity of the resonant frequency may also be achieved by merely connecting the piezoelectric element PZ to the secondary side of the electromagnetic coupling transformer 2, without the connection of the reactance element 4.

Figure 3:
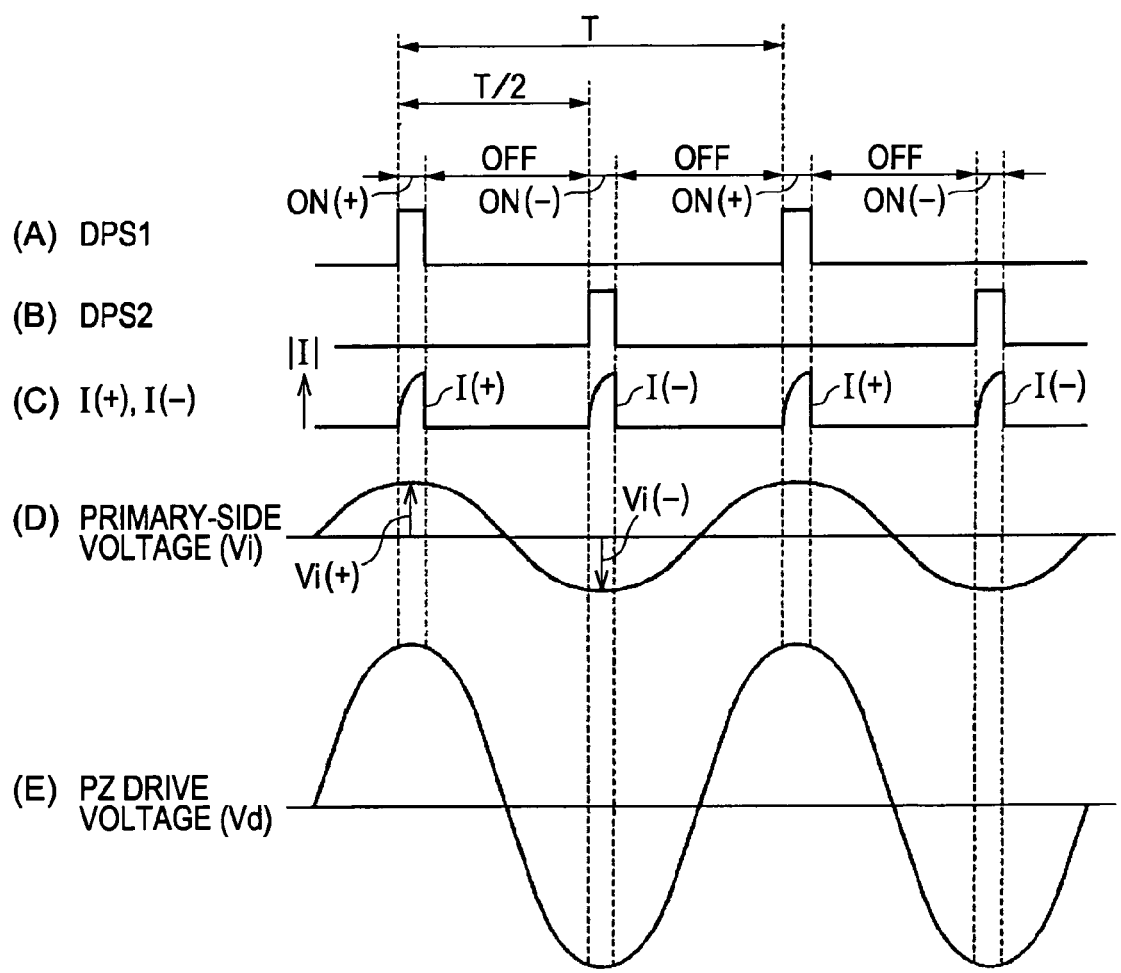
FIG. 3 is a waveform diagram of operation of the circuit shown in FIG. 2.
Figure 4:
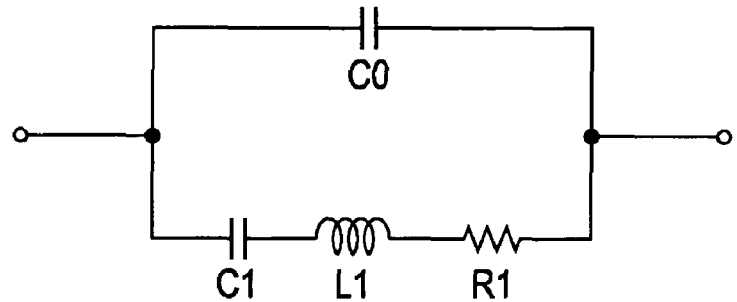
FIG. 4 is an equivalent circuit diagram of a piezoelectric element.

FIG. 3 is an operational waveform diagram of the circuit shown in FIG. 2. FIG. 4 is an equivalent circuit diagram of the piezoelectric element PZ.

As shown in FIG. 4, the piezoelectric element PZ can be expressed by an equivalent circuit having a capacitance C1, an inductance L1, and a resistance R1 which are connected in series and a capacitance C0 that is parallel thereto.

In this case, the resonant frequency of the resonant circuit can be determined from the total capacitance of equivalent capacitance components (mainly C1) of the piezoelectric element PZ and the capacitance C (FIG. 2) of the reactance element 4 and the total inductance of equivalent inductance components (L1) of the piezoelectric element PZ and the inductance of the secondary winding W2.

In a case in which the drive circuit 3 is a two-phase drive circuit, when the first control signal CS1 output from the timer pulse unit 5B shown in FIG. 1 goes high while the second control signal CS2 is low, the switch SW1 is connected to the power-supply voltage Vcc and the switch SW2 is connected to the ground voltage GND. Consequently, the positive current I(+) flows through the primary winding W1, as shown in FIG. 2.

When the second control signal CS2 goes high while the first control signal CS1 is low, the negative current I(−) having an opposite direction flows through the primary winding W1.

As shown at waveform (A) in FIG. 3, the period in which the first control signal CS1 (shown as a first drive pulse signal DPS1) is high is defined by a pulse that continues in a shorter period (indicated by ON (+)) than a constant half-cycle T/2, and this pulse is repeated at a constant cycle T.

As shown at waveform (B) in FIG. 3, the period in which the second control signal CS2 (shown as a second drive pulse signal DPS2) is high is defined by a short duration (indicated by ON (−)) of a pulse having the same cycle T as that of the pulse of the first control signal CS1 and having a phase that is 180° different therefrom. The durations (the so-called "pulse widths") of the two pulses may be different from each other, but are assumed to be the same in this case.

Hereinafter, the pulse duration of the first control signal CS1 is referred to as a "positive-current drive time or an ON (+) time" and the pulse duration of the second control signal CS2 is referred to as a "negative-current drive time or an ON (−) time".

Certain periods of an OFF state in which no current flows through the primary winding W1 exist between an ON (+) time and an ON (−) time and between this ON (−) time and a next ON (+) time.

Since both of the switches SW1 and SW2 shown in FIG. 2 are turned off during the period of the OFF state, the drive circuit 3 is put into a high impedance state, viewed from two opposite ends of the primary winding W1. As a result, since only the amount of off leak current of the transistors flows during the period of the OFF state, the power consumption is virtually equal to zero.

Waveform (C) in FIG. 3 shows the size (the absolute value: |I|) of the positive current I(+) and the negative current I(−).

When the pulse is turned on, current starts to flow and then saturation occurs. In the example of waveform (C), the ON (+) time and the ON (−) time are pre-determined so as to turn off the pulse at the time of the saturation. In an unsaturated area, the current value decreases and the input power decreases. On the other hand, after the saturation, a further increase in the pulse width is not so effective in terms of operation, and instead, only results in an increase in the power consumption. It is, therefore, desirable that the maximum time of the ON (+) time and the maximum time of the ON (−) time be set in the vicinity of the electric-current saturation time.

The voltage across the opposite ends of the primary winding W1 is defined, with respect to the end at which connection to the ground voltage GND in FIG. 2 is controlled, as a voltage (a primary-side voltage Vi) of the end at which connection of the power-source voltage Vcc is controlled. The waveform is shown in waveform (D) in FIG. 3.

When the resistance of the ON state of the transistor is assumed to be negligible, both of the primary-side voltage Vi(+) in the ON (+) time and the primary-side voltage Vi(−) in the ON (−) time have substantially the same value (e.g., about 5 V) as the value of the power-supply voltage Vcc. This intermittent short-duration voltage is forcibly set for the primary winding W1 by the primary-side operation. On the other hand, although the primary-side voltage force applied to the primary winding W1 is released during the OFF period, a voltage that depends on the resonant frequency of the resonant circuit also appears at the primary side because of an influence of the secondary side.

The ratio of the peak value of the primary-side voltage Vi to the peak value of the secondary-side voltage (the drive voltage Vd) is defined by the turns ratio of the electromagnetic coupling transformer 2.

In this operation, as described above, when the current drive frequency (the frequency of operation in which the setting of the primary-side voltages Vi(+) and Vi(−) is repeated) substantially matches the resonant frequency of the resonant frequency, the waveform of the primary-side voltage Vi has substantially a sine wave, as shown at waveform (D) in FIG. 3. This is preferable since the piezoelectric element PZ can be smoothly and efficiently driven.

When the current drive frequency and the resonant frequency do not match each other completely, points at which the waveform of the primary-side voltage Vi is discontinuous arise during the setting of the intermittent primary-side voltage. However, since the operating frequency is defined by the current drive frequency of the primary side, the piezoelectric element PZ can still be driven at a constant frequency. In this case, however, the smooth driving is sacrificed and the efficiency of the driving is also reduced.

When the controller 5 changes the duty ratio of the control signal CS, the amplitude of the positive current I(+) and the negative current I(−), i.e., the absolute value of the voltages, shown at waveform (C) in FIG. 3 also varies in accordance with the duty ratio and the peak value of the drive voltage Vd shown at waveform (E) in FIG. 3 also varies correspondingly.

<Shift in Resonant Frequency>

The resonant frequency may shift depending on factors, such as an ambient temperature. As a result of the shift in the resonant frequency, the secondary-side resonant circuit of the electromagnetic coupling transformer 2 shifts out of the operating point for the low-consumption power driving and power consumption increases significantly. Furthermore, it becomes difficult to obtain an amplitude intended in the duty ratio control, and the accuracy of controlling the piezoelectric element PZ decreases.

Figure 5:
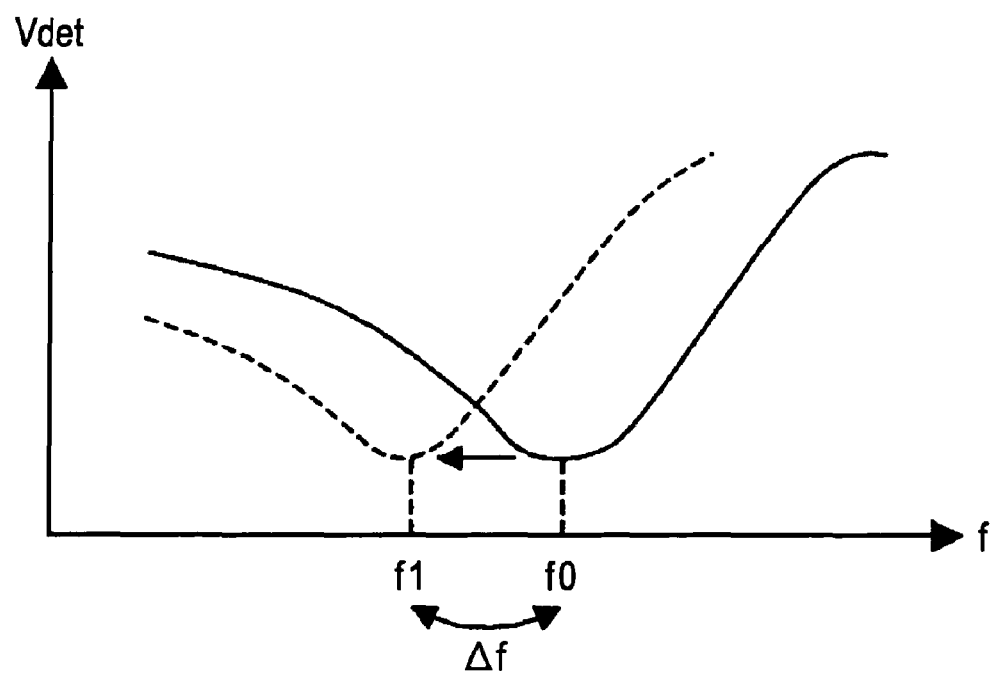
FIG. 5 is a graph showing frequency dependency of a detection voltage in the embodiment of the present invention.

FIG. 5 shows an influence of a temperature increase. More specifically, FIG. 5 is a graph showing frequency dependency of the detection potential Vdet output from the detection circuit 7 (or the AD port 5A having the AC-DC conversion function).

When the frequency f of the control signal CS output from the controller 5 increases under a temperature (e.g., a room temperature of 25° C.) in a steady state, a time-averaged amplitude of the output voltage (the drive voltage Vd) of the electromagnetic coupling transformer 2, the output voltage being monitored at the detection potential Vdet, generally tends to increase and greater driving power is thus applied to the piezoelectric element PZ. However, in a frequency area that is lower than a certain frequency f0, the capacitance components become more dominant than the inductance components in the secondary-side resonant circuit (including the reactance element 4) of the electromagnetic coupling transformer 2. As a result, according to an increase in the frequency f, an average amplitude (the detection potential Vdet) of the drive voltage Vd also decreases.

Consequently, a curve indicating a frequency-dependent characteristic of the detection potential Vdet exhibits a minimum value at a frequency f0, as shown in FIG. 5. This frequency f0 corresponds to the resonant frequency of the resonant circuit, and the drive device 1 performs most-efficient power-saving driving at the frequency f0.

When the temperature increases, however, a phenomenon of shifting of the minimum point (the high efficiency point) of the detection potential Vdet toward the lower frequency side is observed as shown by a curve indicated by a dotted line in FIG. 5.

Thus, the control signal CS (the first control signal CS1 and the second control signal CS2 in the case of the two-phase drive) is set with the constant frequency f0 and a constant duty ratio. Thus, in the example shown in FIG. 5, when the temperature increases during the driving of the piezoelectric element PZ, the average amplitude level of the drive voltage Vd increases and excessive driving power is applied to the piezoelectric element PZ.

<Frequency Search Control>

With an aim to deal with the phenomenon of such resonant frequency shift due to influences such as a temperature, frequency search is performed in the present embodiment, and on the basis of a result of the search, frequency-search control is performed to control the frequency of the control signal CS so as to achieve driving in the vicinity of the resonant frequency.

The frequency search control is executed by the controller 5 using the detection potential Vdet. Some specific approaches for the control are described below. A procedure for the control is given as a program sequence executed by the controller 5.

The frequency search control in the present embodiment is control that the controller 5 performs on the electromagnetic coupling transformer 2 and the drive circuit 3. More specifically, the frequency search control features changing the frequency of the control signal CS in the frequency range FR multiple times, detecting an impedance change in the piezoelectric element PZ each time the frequency is changed, determining the resonant frequency fr of the piezoelectric element PZ on the basis of the transition of the impedance changes, and controlling the frequency of the control signal CS so that the determined resonant frequency fr is obtained.

Figure 6:
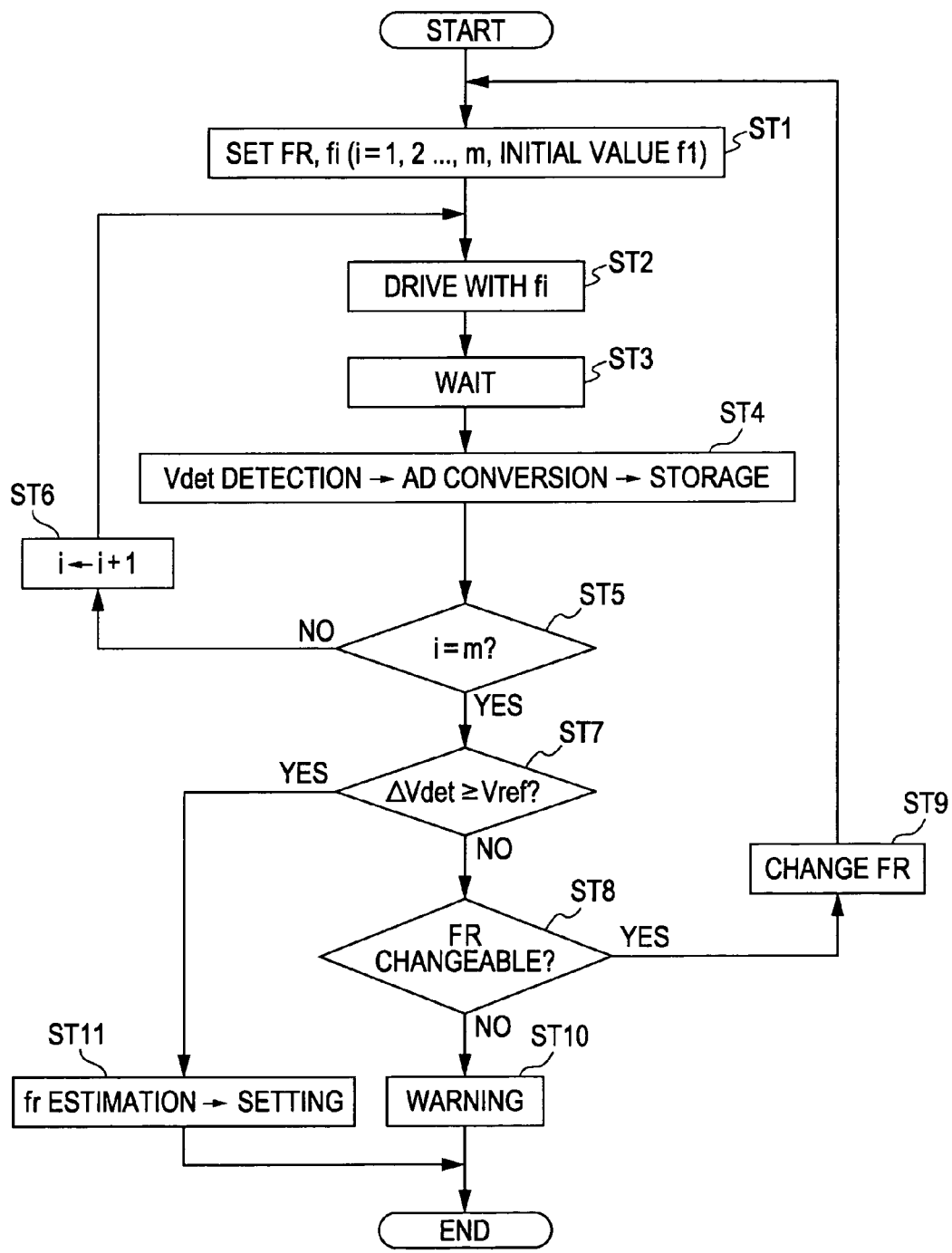
FIG. 6 is a flowchart showing a method for controlling a drive frequency of the piezoelectric element according to the embodiment of the present invention.

FIG. 6 is a flowchart showing the frequency search control.

In addition to the basic control operation of the above-described feature, the control shown in FIG. 6 includes, but is not limited to, a control operation for comparing the difference between a maximum value and a minimum value of detection values with a predetermined reference value to determine whether or not the setting of the frequency range FR is valid, a control operation for changing the frequency range FR on the basis of a result of the comparison and so on, and a control operation for issuing a warning indicating that the presence of an abnormality when the frequency range FR is unchangeable for a reason that, for example, no selectable frequency range FR remains in a given frequency band.

The control operations may be arbitrarily combined. For example, one of the optional control operations may be added to the above-described basic control or any two selected ones of the control operations may be added in combination.

The control shown in FIG. 6 is executed by the controller 5 shown in FIG. 1, unless otherwise specifically stated.

Figure 7:
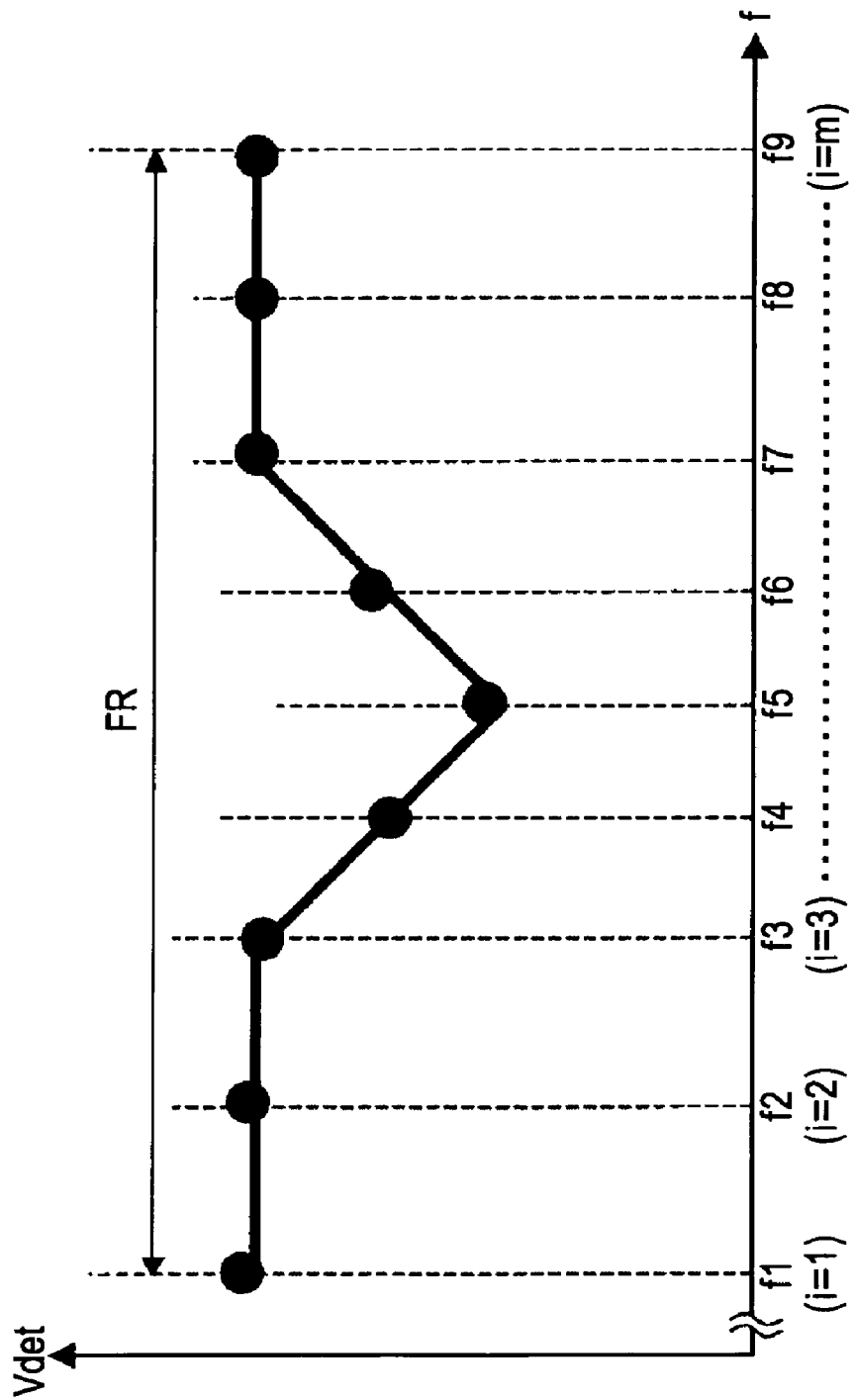
FIG. 7 is a graph illustrating a frequency range in the embodiment of the present invention.

In FIG. 6, when processing is started, initial setting for the frequency range FR and a selection frequency fi of the control signal CS is performed in step ST1. The term "frequency range FR" herein refers to an arbitrary partial frequency area having a certain frequency width in a frequency band, for example, as shown in FIG. 7. The processing shown in FIG. 6 is performed in the frequency range FR. The term "selection frequency fi" refers to one of different frequencies in the frequency range FR, and represents, for example, each of m−1 frequencies obtained by dividing the frequency range FR from a smaller frequency to a larger frequency (or vice versa). The division may or may not be equal division. When the frequency range FR is not equally divided, it is preferable that the division has regularity, for example, the division widths be reduced toward the center of the frequency range FR.

In step ST1 in FIG. 6, a frequency f1 (i=1) is selected as an initial value.

In step ST 2 in FIG. 6, the controller 5 shown in FIG. 1 outputs the control signal CS having the set frequency f1 (i=1) to thereby drive the drive circuit 3. In response, the drive signal DS for the piezoelectric element PZ varies in accordance with the frequency f1 and the predetermined duty ratio (having a fixed value) of the control signal CS to vibrate the piezoelectric element PZ.

The piezoelectric element drive takes long time from when the control signal CS varies until the vibration of the piezoelectric element PZ reaches its steady state. Thus, the piezoelectric element drive has a predetermined waiting time shown in step ST3 in FIG. 6.

When the predetermined waiting time elapses in step ST3, the process proceeds to step ST4. In step ST4, the controller 5 reads, as a digital value, a detection value (e.g., a detection potential Vdet) of a presently given impedance change of the piezoelectric element PZ in step ST4. The read detection value is temporarily stored in a memory (e.g., a register) in the controller 5.

Next, in step ST5, the variable i is compared with a constant m to determine whether or not i=m is satisfied. Since the present variable i is 1 (<m), the result of the comparison (determination) is NO.

In this case, in step ST6, the variable i is incremented by 1 and the processing flow returns to step ST2.

Thus, steps ST2 to ST6 are repeated until i=m is satisfied in step ST5. Because of m=9 in the case of FIG. 7, the loop is also repeated nine times.

When i=m is satisfied in step ST5, the processing flow proceeds to step ST7.

In step ST7, the controller 5 determines whether or not the set frequency range FR is appropriate on the basis of the detection values detected in the above-described repeated loop and stored in the memory.

Figure 8:
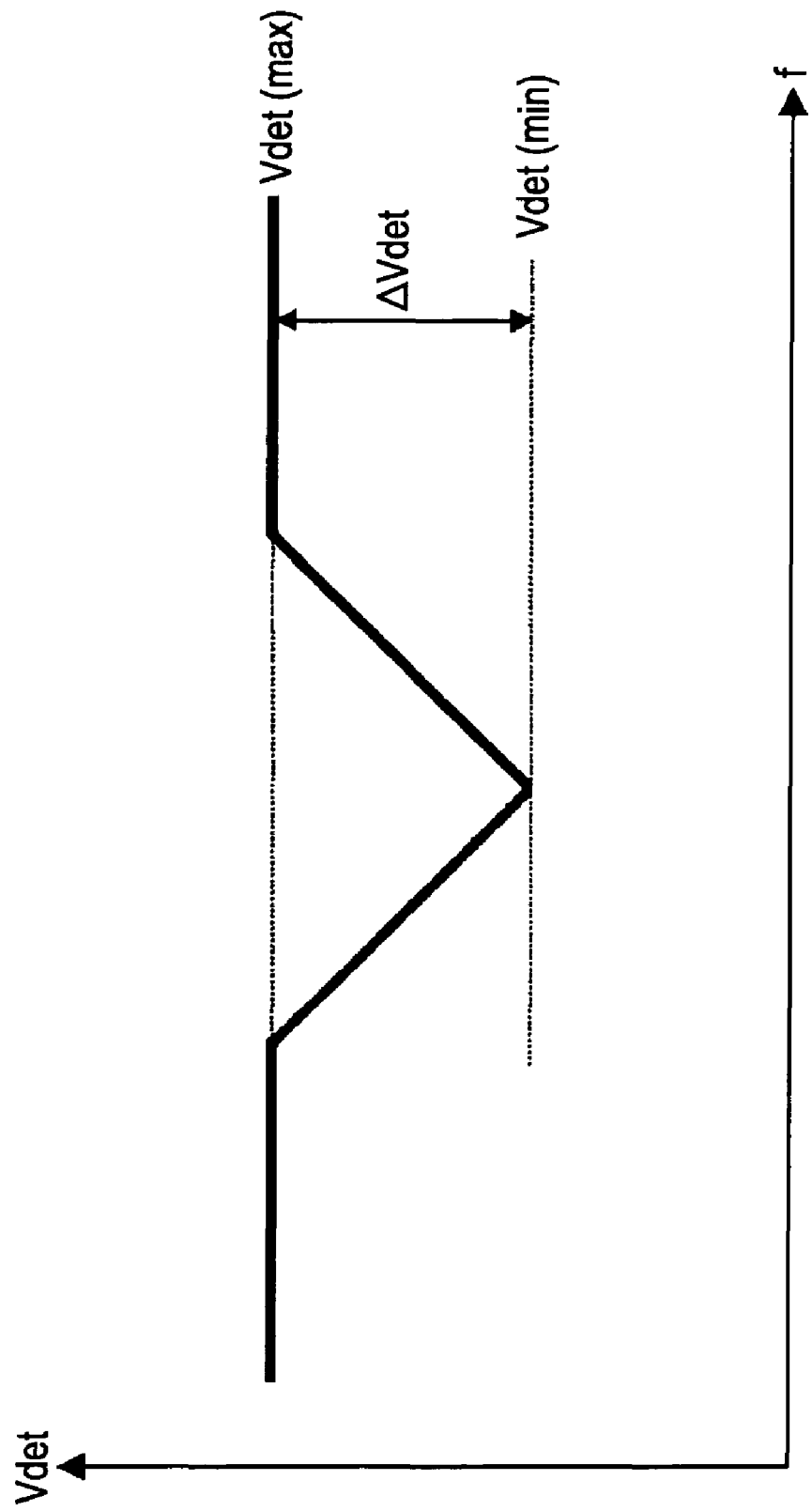
FIG. 8 is a graph illustrating a case in which whether a detection value is valid or invalid is determined in each frequency range, according to the embodiment of the present invention.

More specifically, the controller 5 determines a maximum value Vdet(max) and a minimum value Vdet(min) from the stored detection values and obtains a difference ΔVdet therebetween, as shown in FIG. 8. The controller 5 then compares the difference ΔVdet with a predetermined reference value Vref. When the result of the comparison shows that the difference ΔVdet is larger than or equal to the reference value Vref, the controller 5 presumes that the currently set frequency range FR is valid and a resonant frequency fr exists in the frequency range FR. On the other hand, when the difference ΔVdet is smaller than the reference value Vref, the result in step ST7 is NO and the processing flow proceeds to step ST8.

In step ST8, a determination is made as to whether or not another frequency range FR can be selected in a predetermined frequency band. This determination corresponds to one example of making a determination as to whether or not the frequency range FR is changed to select all frequencies contained in the frequency band and the detection of the impedance change (e.g., the detection potential Vdet) therein is completed.

When the determination result in step ST8 is NO, no further selection is performed and the processing flow proceeds to step ST10. In this case, since some kind of abnormality may be occurring, the controller 5 performs processing, such as displaying an "abnormality warning" on the display 9 shown in FIG. 1. More specifically, the controller 5 outputs an instruction for suspending the drive of the piezoelectric element PZ and issuing an abnormality warning to an image controller of the display 9. This arrangement can inform the user of the abnormality.

On the other hand, when the determination result in step ST8 is YES, the frequency range FR is changed in step ST9 and the processing flow returns to step ST1.

That is, steps ST1 to ST9 are repeated until a frequency range FR that is highly likely to contain the resonant frequency fr is found in step ST7 and the processing flow advances to step ST11 or until it is determined in step ST8 that all frequency ranges FR are selected and the processing flow proceeds to step ST10 for abnormality warning. After the warning, the processing shown in FIG. 6 ends.

On the other hand, in step ST11, on the basis of the detection results obtained from the frequency range FR in which the difference ΔVdet is larger than or equal to the reference value Vref and the resonant frequency fr is highly likely to be included, the controller 5 estimates the resonant frequency fr.

The estimation of the resonant frequency fr is performed by one of the following methods or a combination thereof.

[First Estimation Method]

Figure 9:
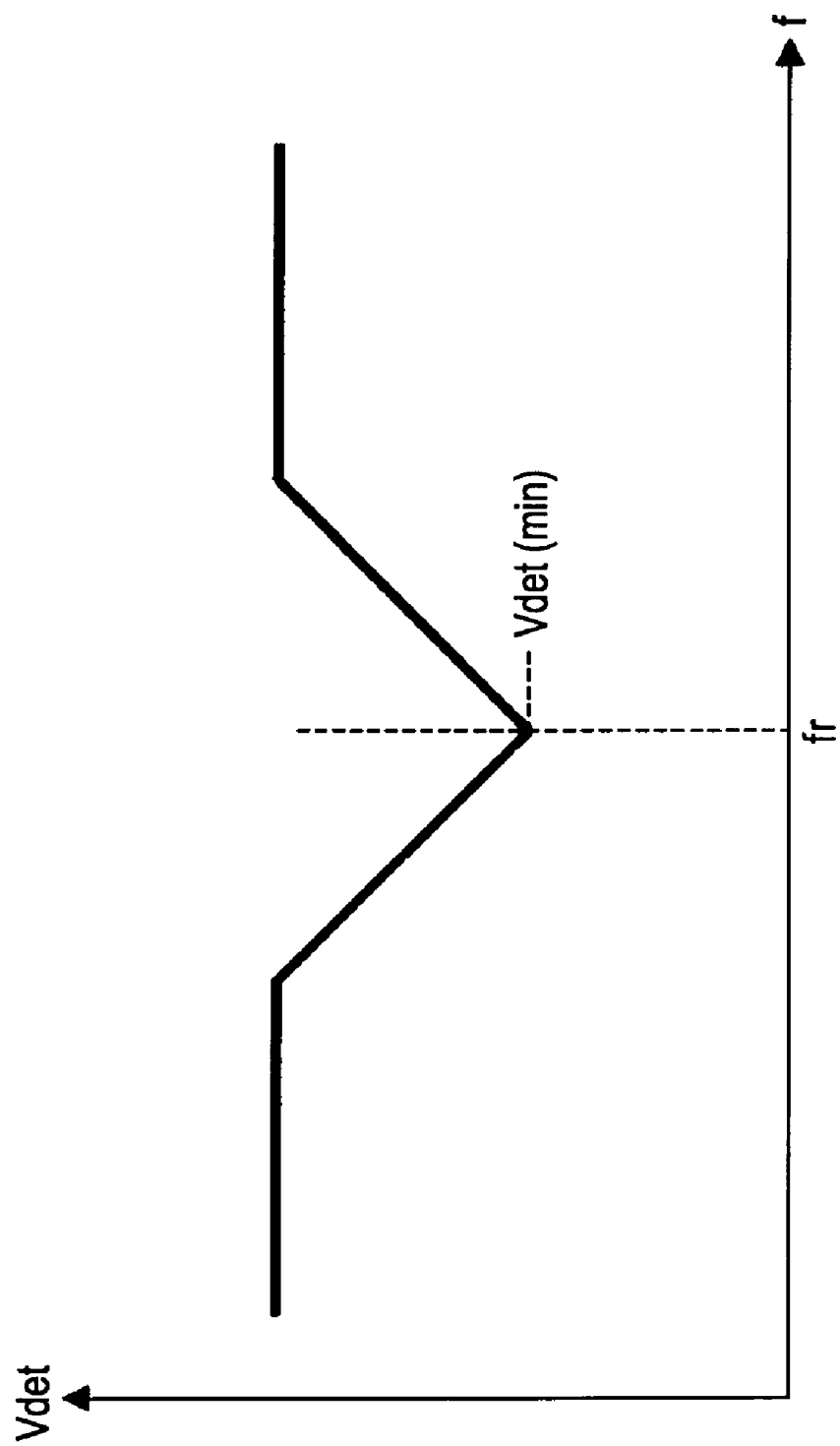
FIG. 9 is a graph illustrating a method for detecting a resonant frequency according to the embodiment of the present invention.

In this method, the frequency of the control signal CS which corresponds to a minimum value Vdet(min) shown in FIG. 9 is estimated to be the resonant frequency fr.

When multiple minimum values exist, the minimum value at which the frequency is the lowest and power consumed during the generation of the control signal CS is smaller may be estimated as the resonant frequency fr.

Even if the frequency of the control signal CS is the same, a change in the duty ratio causes the resonant frequency fr to change. This is because the impedance of the piezoelectric element PZ increases according to an increase in the duty ratio. Thus, the aforementioned minimum value and the duty ratio may be used to estimate the resonant frequency fr.

[Second Estimation Method]

Figure 10:
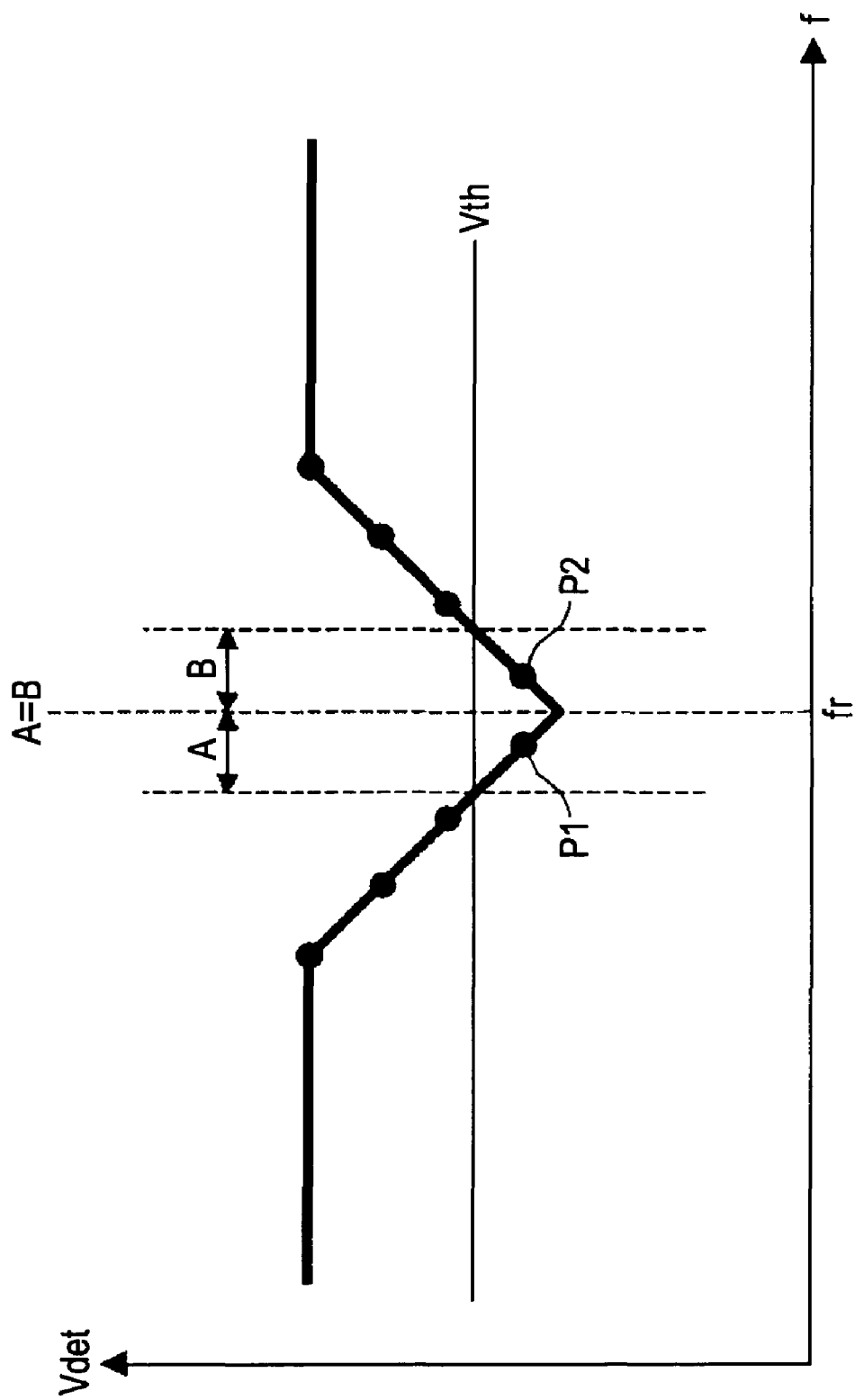
FIG. 10 is a graph illustrating another method for detecting a resonant frequency according to the embodiment of the present invention.

In this method, for example, as shown in FIG. 10, a threshold Vth which the resonant frequency fr is assumed to be smaller than or equal to is set, and the average value of the frequencies of the control signal CS which correspond to two intersections at which a trace connecting detection points intersects a straight line indicating the level of the threshold Vth is estimated to be the resonant frequency fr. Thus, the resonant frequency fr obtained by this method is given by a frequency at which distances A and B from the two intersections are equal to each other.

In the example of FIG. 10, two detection points exist in the vicinity of the minimum value. When the minimum value is assumed to be the resonant frequency fr, it is slightly different from the true resonant frequency fr. This method, however, has an advantage in that a frequency that is closer to the true value can be estimated to be the resonant frequency fr, since the resonant frequency fr is estimated from the intersections of the trace connecting the detection points and the threshold Vth.

For example, when the resonant circuit repeatedly exhibits capacitive and inductive impedances or when temperature characteristics and so on of devices other than the piezoelectric element PZ are intricately related (though, such a case is not particularly shown), the number of intersections in the second estimation method described above may be three or more. In such a case, two intersections at which the average of the frequencies is to be obtained may be identified in combination with the minimum value of the detection values, or two outermost intersections may be used to obtain the average of the frequencies.

In general, however, the resonant frequency fr often exists at the lowest frequency side. Instead of use of the frequency at the lowest frequency side, the frequency at an intersection corresponding to the lowest frequency and the frequency at an intersection corresponding to the second lowest frequency may also be selected. Such a scheme also allows a frequency that is close to the true resonant frequency to be obtained, and thus has no significant disadvantage. In this case, since the driving is performed at a further lower frequency, there is also an advantage in that at least the power consumption during the generation of the control signal CS can be minimized. Accordingly, it is more desirable to employ the method for taking the average of the frequency at the intersection corresponding to the lowest frequency and the frequency at the intersection corresponding to the second lowest frequency.

[Noise Elimination Method]

In step ST4 shown in FIG. 6, it is desired that, each time a detection value is obtained, a determination be made as to whether or not the detection value is a valid detection value.

Figure 11:
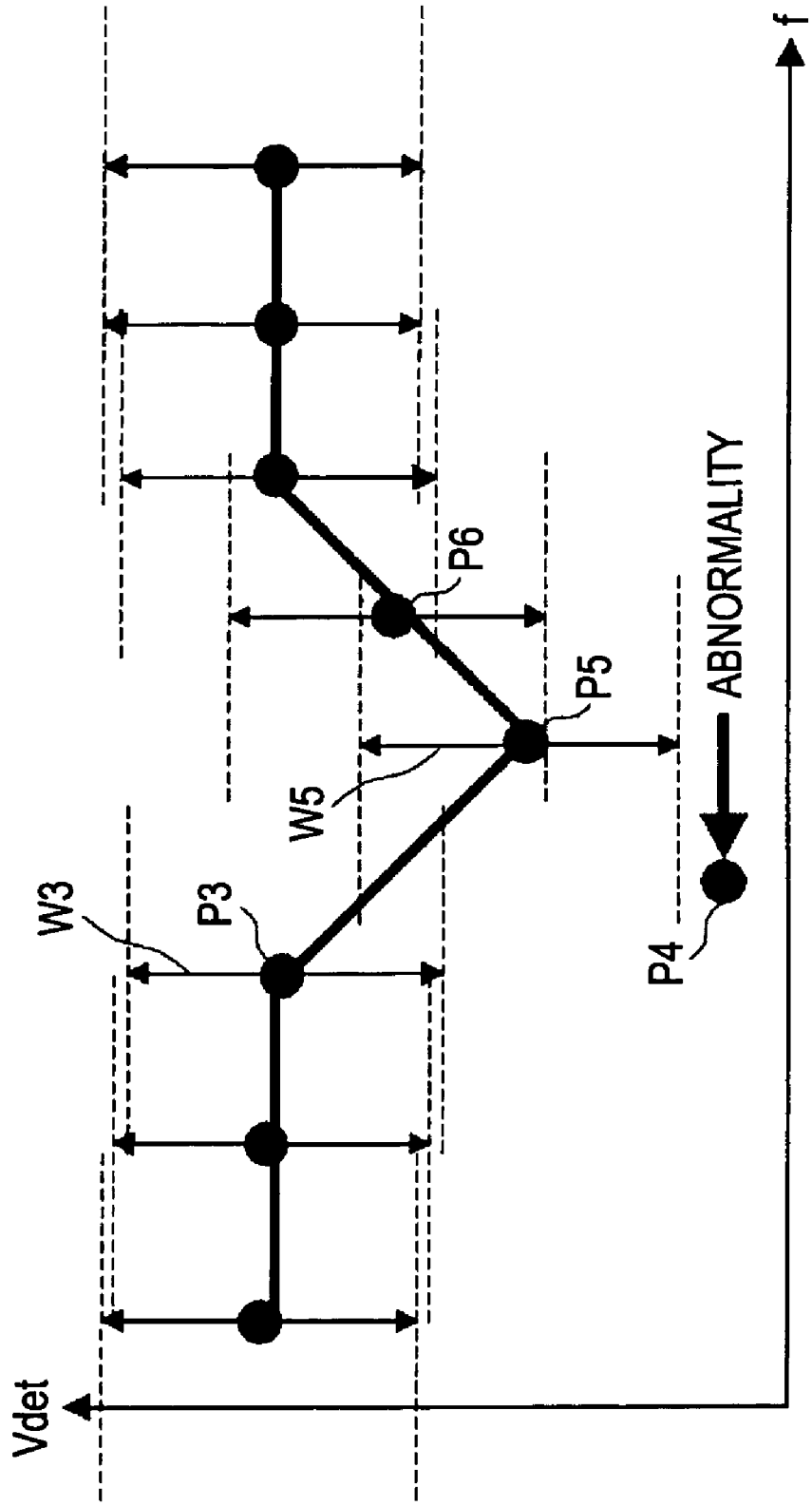
FIG. 11 is a graph illustrating a noise-influence eliminating method according to the embodiment of the present invention.

In this method, as shown in FIG. 11, when one detection value is detected, a determination is made as whether or not the detection value is within a window W of an adjacent detection value, for example, of a detection value obtained in the immediately preceding detection. The window W is set to have a width, for example, at the positive and negative sides in an impedance (Vdet) change relative to a detection point P.

For example, since a detection point P4 obtained next to a detection point P3 is not within a window W3 of the detection point P3, it is determined that the detection point P4 is an abnormal point at which the amount of noise or the like is large, and thus, the detection point P4 is removed from basic data for the estimation. In contrast, for example, a detection point P6, which is a normal detection point, is within a window W5 of a detection point P5, and is thus used as the basic data.

Such consideration of an abnormality induced by noise or the like for each detection and eliminating the influence of the nose makes it possible to effectively prevent noise-induced erroneous estimation of the resonant frequency fr.

In the present embodiment, the processing shown in FIG. 6 may be periodically executed.

According to the present embodiment, it is possible to easily estimate the resonant frequency from impedance changes in a piezoelectric element, unlike a method that involves an increased circuit size for phase comparison. The present invention, therefore, offers an advantage in that the piezoelectric element may be driven at a continuously efficient, low-power consumption operating point according to changes in an environmental factor, such as a temperature.

Second Embodiment

Although the processing loop in FIG. 6 is cyclically executed in the first embodiment described above, the cycle of the processing loop in a second embodiment is varied according to a temperature. Thus, the drive device 1 in the second embodiment has, as a basic element, the temperature detection circuit 8 shown in FIG. 1, particularly, a temperature detection element 8A included therein.

The temperature detection circuit 8 is provided to keep track of a temperature at a location where the piezoelectric element PZ and the drive device 1 are disposed, for example, a temperature inside electronic equipment in which they are incorporated. The temperature detection element 8A included in the temperature detection circuit 8 is a device having a parameter that varies according to a temperature. Examples of the temperature detection element 8A include a temperature sensor and a thermistor. The temperature detection circuit 8 includes, in addition to the temperature detection element 8A, a circuit for supplying power to the temperature detection element 8A and for generating a temperature detection signal St by performing predetermined processing, such as amplification, on a detected temperature or on a signal indicating a change in a temperature-dependent parameter.

The temperature detection circuit 8 outputs the temperature detection signal St to the controller 5, and the AD port 5A therein reads a detection potential as a digital value.

In the present embodiment, for example, the controller 5 performs control so as to execute the processing loop (show in FIG. 6) at a shorter cycle as the temperature increases. The arrangement may also be such that, in a temperature range in which the resonant frequency fr is presumed to rarely change, the execution of the processing loop is nearly stopped, for example, the processing loop is occasionally executed only once for check, and when the temperature exceeds a certain temperature, the processing loop is more frequently executed as the temperature increases.

The present embodiment offers an advantage in that unwanted power consumption can be reduced by executing frequency sweep control only when a temperature change occurs or by increasing the frequency of the execution of the frequency sweep control.

Third Embodiment

A third embodiment is directed to a pump device, which is an example of application of the drive circuit according to the first or second embodiment described above. The pump device according to the third embodiment of the present invention can be applied to a variety of pump devices for air, other gases, and fluids such as liquids. A description below is particularly given of an air pump device that is applicable to an air-cooling device that air-cools a heated object (e.g., an electronic device, such as an IC), a device that produces constant airflow in a narrow conduit, or the like.

An air pump device is useful as a countermeasure system against an internal-temperature increase in mobile equipment or stationary equipment. In particular, since the housing of mobile equipment is small, there are cases in which a legacy fan-type air-cooling device cannot be disposed therein.

A piezoelectric-element-based air-pump device (hereinafter, simply referred to as a "piezoelectric pump") features the ability to gain, with a small size, an air discharge pressure as high as a level that is not obtainable by a fan-type pump. Accordingly, the piezoelectric-element-based air-pump device is particularly useful as a countermeasure system against an internal-temperature increase in mobile equipment.

In recent years, with increasingly higher performances of electronic devices such as audio video recording/playback devices and so on, the power consumption of the devices also tends to increase. In addition, miniaturization of the devices also results in generation of a large amount of heat in small housings. If the generated heat is left uncontrolled, built-in precision devices may cause thermal runaway or the like. Since users of the devices are also conscious of heat generation, it is desired that heat generation be minimized.

However, since the housings of the electronic devices are generally hermetically sealed, heat generated can only be rereleased through spontaneous heat release unless technical measurements are taken. This poses a technical challenge to miniaturization.

A fan-type air-cooling system is often used for cooling typical electrical equipment, but is not suitable for small-size equipment. Thus, a heat-exhaust pump using a resonant device (a piezoelectric-member unit) is often employed for small-size equipment. A piezoelectric member unit used for heat exhaustion of relatively large-size equipment, such as a notebook computer, and a piezoelectric member unit used for small-size electronic equipment, such as a semiconductor-memory audio device, are different from each other in that the resonant frequencies thereof change differently relative to the temperature. In particular, small-size electronic equipment often employs a small-size piezoelectric member unit whose resonant frequency is susceptible to a temperature change. Since susceptibility to heat is proportional to the surface area of the object itself, characteristics of the piezoelectric member unit disposed in a small area are also easily affected by the amount of heat generated in the electronic apparatus. That is, since a volume is expressed by the third power of a dimension and an area is expressed by the square of a dimension, the smaller (volume) an object is, the more it is relatively susceptible to heat. Thus, the resonant frequency of the piezoelectric member unit used in small-size electronic equipment is highly likely to vary. In addition, for small-size piezoelectric member units, dimension variations during manufacture are relatively large, and together with aging, some of the devices may have nonuniform resonant frequencies.

In order to address such a problem, the frequency sweep control in the first or second embodiment of the present invention can be advantageously used.

Figure 12:
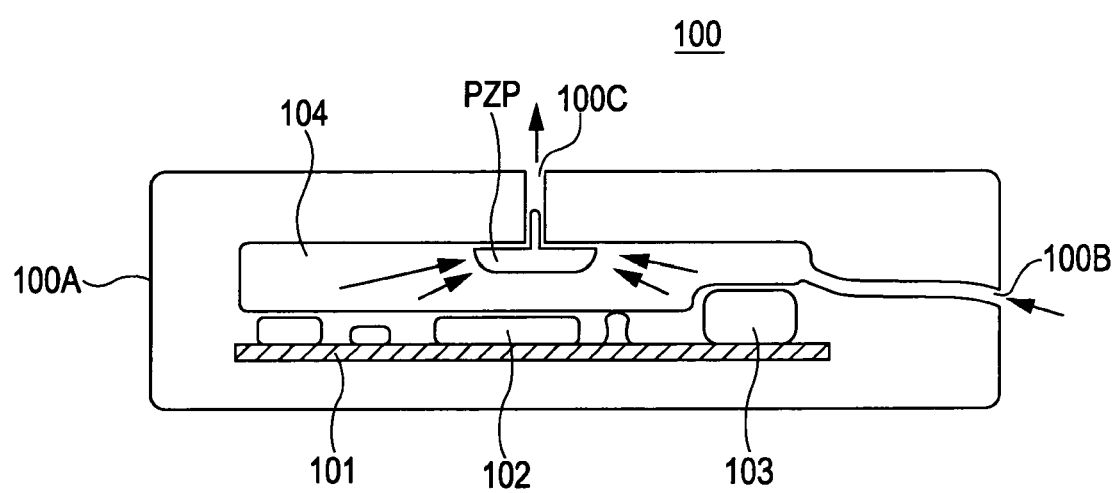
FIG. 12 is a sectional view showing the structure of an electronic apparatus according to a third embodiment of the present invention and provision of a piezoelectric pump.

FIG. 12 schematically shows the internal configuration of an electronic apparatus including a piezoelectric pump.

The electronic apparatus illustrated in FIG. 12 may be any equipment, such as a digital camera for capturing still images or moving images, a game machine, a mobile phone, an audio/video (recorder) player, a computer, a car navigation system, or other multimedia equipment.

This electronic apparatus 100 illustrated in FIG. 12 has a circuit board (or circuit boards) 101 in its housing 100A. A circuit component 102, a power-supply control component 103, other ICs (integrated circuits), and so on are disposed on the circuit board 101 at a high density.

The electronic apparatus 100 in the present embodiment has a heat collecting portion 104 that defines a space shielded to some degree. The heat collecting portion 104 has a size, shape, position, and material so as to allow efficient collection of heat from all heat-generating components, including the circuit component 102 and the power-supply control component 103.

The heat collecting portion 104 has fins (not shown) for collecting heat. The fins are made of a highly heat-conductive material and are positioned in contact with or in proximity to the heat generating portions of the components. Air in the space in the heat collecting portion 104 is heated by heat collected via the fins thereof or external walls.

External surfaces of the housing 100A have an inlet port 100B and an outlet port 100C that communicate with the space in the heat collecting portion 104. The diameters of the inlet port 100B and the outlet port 100C may be relatively small, for example, several millimeters. In order to ensure that the inlet port 100B and the outlet port 100C are not completely covered with a palm or a finger, they are designed with a particular arrangement, for example, being positioned in recesses or adjacent to protrusions.

A piezoelectric pump PZP that serves as a pump device is fixed in the heat collecting portion 104 at a position where air can be efficiently suctioned from the surrounding space and can be efficiently discharged to the outlet port 100C.

The piezoelectric pump PZP has therein the piezoelectric element PZ shown in FIG. 1 and is connected to the drive device 1. The drive device 1 may be disposed on the circuit board 101. The temperature detection element 8A of the temperature detection circuit 8 is also disposed at a position where it can accurately detect an in-equipment temperature determined by integration of heats from the individual components. For example, the temperature detection element 8A may be disposed at a position adjacent to the outlet port 100C in the heat collecting portion 104 in FIG. 12.

The piezoelectric pump PZP, in conjunction with the above-described structures of the electronic apparatus 100 and the disposition of the piezoelectric pump PZP therein, serves as an air-transfer driving source for generating airflow in the heat collecting portion 104 and causing the airflow to forcibly discharge heat generated by the heat generating elements, such as ICs.

Figure 13:
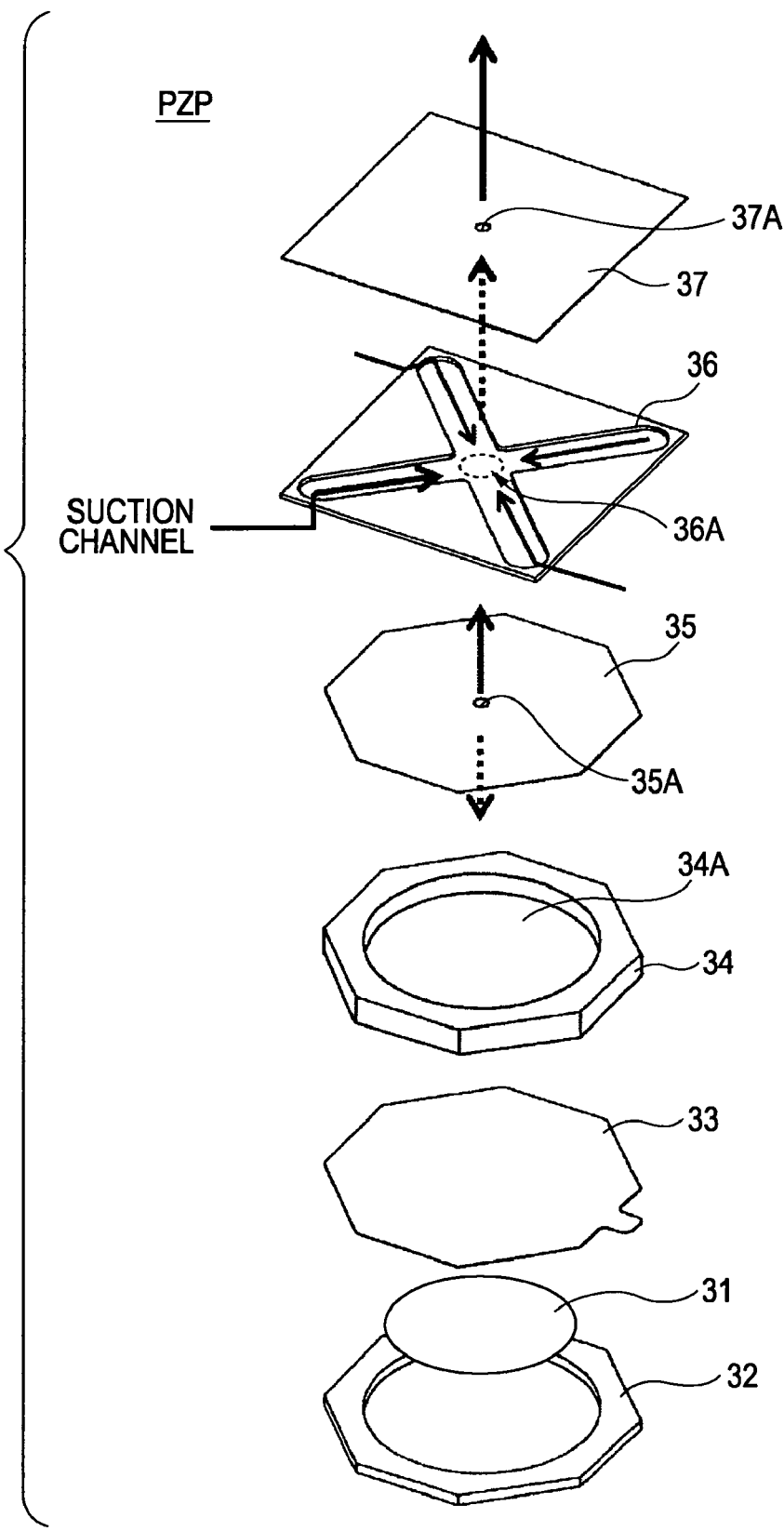
FIG. 13 is an exploded view of an air piezoelectric pump device for use as an air-cooling device according to the third embodiment.

FIG. 13 is an exploded view of the piezoelectric pump PZP.

The illustrated piezoelectric pump PZP has a piezoelectric member unit 31 serving as the piezoelectric element PZ, a protection ring 32, a diaphragm 33, a first spacer 34, an intermediate plate 35, a second spacer 36, and a top plate 37.

The protection ring 32 contains, for example, a highly corrosion-resistant, rigid material, such as stainless, and has a ring shape that defines a space therein. The piezoelectric member unit 31 is placed in the protection ring 32 and a non-vibrating portion of the piezoelectric member unit 31 is fixed thereto. The first spacer 34 is placed on the protection ring 32 with the diaphragm 33 interposed therebetween.

The first spacer 34 contains, for example, a highly corrosion-resistant, rigid material, such as stainless, and has a ring shape so that a space therein acts as a pump chamber 34A.

The diaphragm 33 is one type of vibrating member that vibrates in conjunction with vibration of the piezoelectric member of the piezoelectric member unit 31. The diaphragm 33 also does a job of enhancing the airtightness at its interface with the first spacer 34.

The intermediate plate 35 has a small communication port 35A at its center, and is placed on and is securely attached to the upper surface of the first spacer 34 so that the interface therebetween becomes highly airtight. Thus, the pump chamber 34A communicates with the outside of the electronic apparatus 100 only through the communication port 35A. Accordingly, when the piezoelectric member of the piezoelectric member unit 31 vibrates to cause up-and-down movement of the diaphragm 33, an increase and a decrease in the internal volume of the pump chamber 34A are repeated to thereby cause air to go out and come in through the communication port 35A at high speed.

In addition, the second spacer 36 is made of a highly corrosion-resistant, rigid material, such as stainless. The second spacer 36 and the top plate 37 are securely attached to the intermediate plate 35 so that their interfaces become highly airtight.

The second spacer 36 may have a space (e.g., four passages) therein to provide channels for suctioning air from, for example, four sides. One end of each of the four passages is substantially closed and has a small opening for an inlet port. The top plate 37 has at its center an opening for an air outlet port 37A. With this arrangement, a venturi nozzle portion 36A that communicates with the outlet port 37A and the communication port 35A is provided at the center portion of the second spacer 36.

Figure 14A:
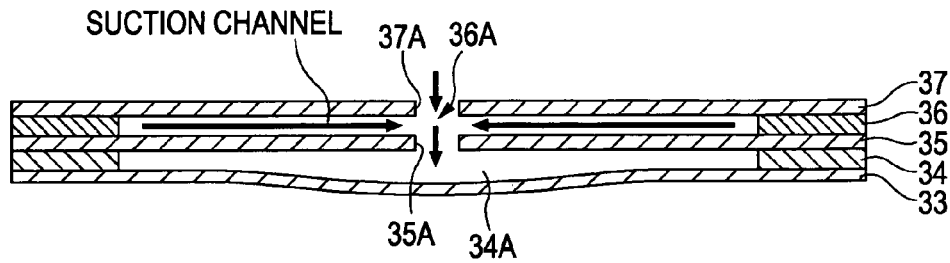
FIGS. 14A and 14B are sectional views showing an air channel of the piezoelectric pump according to the third embodiment of the present invention and FIG. 14C is a perspective view thereof.
Figure 14B:
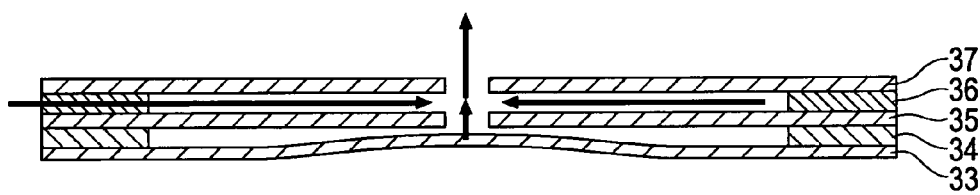

FIGS. 14A and 14B are schematic sectional views each showing an air channel in the piezoelectric pump PZP. More specifically, FIG. 14A shows an air channel during suction and FIG. 14B shows an air channel during discharge.

When the piezoelectric member unit 31 slowly moves the diaphragm 33 up and down, the volume of the pump chamber 34A is increased by suction to cause air to enter through a channel shown in FIG. 14A. The volume of the pump chamber 34A is reduced by discharge and, as shown in FIG. 14B, air in the pump chamber 34A is discharged from the outlet port 37A through the communication port 35A and the venturi nozzle portion 36A at a high rate.

Repeated operation of the suction and the discharge at a high rate (with a frequency of 20 kHz or more) causes a continuous airflow with a substantially constant pressure to be discharged from the discharge port 37A. In this high-rate operation, the discharge port 37A acts as a discharge port by itself, rather than acting as an air inlet port as in FIG. 14A. Thus, air is suctioned through the space of four suction channels (shown in FIG. 13), formed at the second spacer 36, and small holes (suction ports), each provided in one end of each suction channel.

Figure 14C:
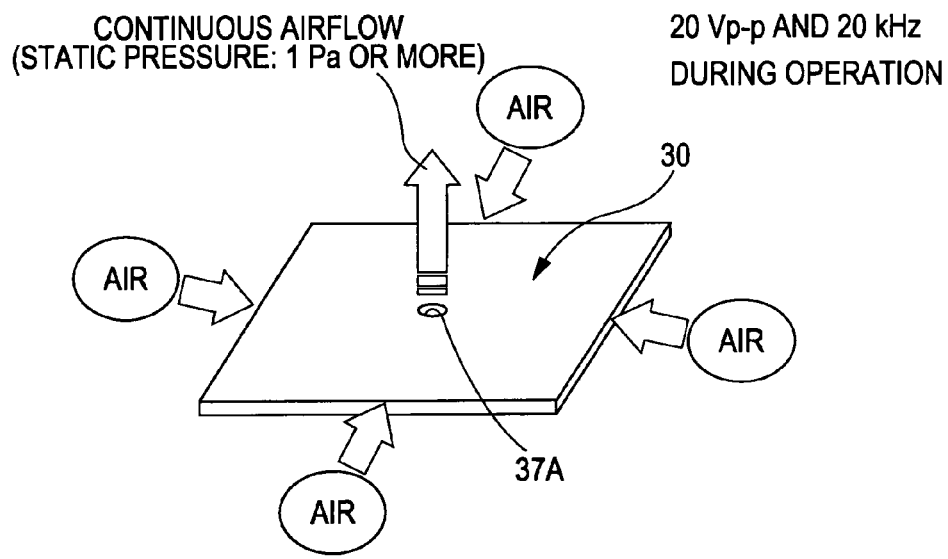

FIG. 14C is an external view showing the piezoelectric pump PZP that is preferably used as a cooling device and also showing an air channel during operation.

The piezoelectric pump PZP can be used as a small-size air-cooling device having a size of about 20×20 mm in plan view and a thickness of about 1 mm. The drive circuit 1 illustrated in FIG. 2 and described above in conjunction with the first embodiment may be used for the piezoelectric pump PZP. In such a case, when the driving is performed with 20 Vp-p and 20 kHz, one to several pascals (Pa) is obtained for the static pressure of a continuous airflow discharged from the outlet port 37A.

The piezoelectric pump PZP that has the above-described structure and that operates as described above can be used in place of the piezoelectric element PZ shown in FIG. 1 and can be driven by the drive device 1.

In this case, the frequency sweep control described above with reference to FIG. 6 and in conjunction with the first embodiment is performed or the cycle of the frequency sweep control in the second embodiment is changed according to a temperature.

In particular, when the state of the equipment used changes depending on the environment, the load of the piezoelectric pump PZP also fluctuates. Thus, when the drive frequency is pre-fixed, the resonant frequency shifts and not only active power but also reactive power is generated. As a result, the airflow generation efficiency of the piezoelectric vibration element declines and the piezoelectric pump PZP also produces heat.

A frequency-characteristic variation due to an ambient temperature is significant as an environmental fluctuation factor, and correcting the variation and performing control so as to constantly achieve an optimum operating frequency with the highest efficiency is effective for power saving.

The above-described arrangement can achieve an electronic apparatus having low-power consumption with a simple drive-device configuration while effectively preventing heat generation. The simple configuration also contributes to a reduction in the power consumption of the electronic apparatus.

With small-size electronic equipment, however, airflow noise may become problematic.

More specifically, since a quite complicated airflow is formed in the vicinity of the outlet port, it is preferable that an airflow volume be appropriately controlled in order to reduce airflow noise output from the discharge port.

Fourth Embodiment

Accordingly, according to a fourth embodiment of the present invention, for example, as shown in FIG. 15, with respect to a recording mode and a playback mode, a combination of an operation with a fixed airflow volume or an operation with control of an airflow volume depending on a temperature may be determined and set as airflow-volume modes 1 to 4. From the viewpoint of the recording mode, playback mode, heat exhaust, power consumption, and so on, the controller 5 performs comprehensive control for appropriately switching among the airflow-volume modes to thereby allow an equipment microphone to effectively pick up airflow noise from the outlet port, resonant sound of the device, and so on.

Next, a description will be given of modifications that can be arbitrarily combined with the first to third embodiments described above.

<First Modification>

A parameter, other than the detection potential Vdet, that varies according to an impedance change in the piezoelectric element PZ may be obtained from the piezoelectric element PZ.

<Second Modification>

In the first embodiment, the frequency range FR is set in a frequency band and is changed therein to determine the resonant frequency fr.

However, for example, in a special situation in which a change in the resonant frequency fr is relatively small even when the temperature or the like changes up to the limit of a guaranteed temperature range defined by specifications or the like, the frequency range FR may be fixed in a range including the resonant frequency fr so that the frequency range FR is searched only once. That is, steps ST8 and ST9 shown in FIG. 6 may be eliminated so that, when the result of the determination in step ST7 is NO, the warning is issued in step ST10.

<Third Modification>

Although the detection values are obtained in the control shown in FIG. 6 through sequential selection of frequencies in the frequency range FR, multiple detection values may be obtained through random frequency selection. The arrangement may also be such that at first the detection values are sequentially obtained, so a range in which the resonant frequency fr is likely to exist is narrowed down, and then more specific detection values are sequentially or randomly obtained.

When the result "NO" is continuously obtained in the determination in step ST7 shown in FIG. 6 or the result of the determination in step ST8 is NO, for example, the processing in FIG. 6 may be restarted from the beginning with, for example, a reduced frequency pitch, rather than directly processing to step ST10 for issuing the warning.

<Other Modifications>

The reactance element 4 shown in FIG. 2 can also be connected in parallel with the primary winding W1 of the electromagnetic coupling transformer 2.

To which of the primary side and the secondary side of the electromagnetic coupling transformer 2 the reactance element 4 is to be connected may be determined in accordance with the withstand-voltage specification and the reactance value of the reactance element 4.

The drive circuit 3 may be configured with one transistor (and a diode for reverse-flow prevention), instead of the two-switch configuration (each switch switching between two contacts) or the H-bridge configuration that realizes the two-switch configuration with four transistors. With the configuration with one transistor, since two-phase signal drive is not performed, the efficiency is low but there is an advantage in that the drive circuit 3 can be simplified.

The frequency may be changed by cyclically stopping the control pulse according to a predetermined regulation. The stop control may be achieved using the controller 5, or alternatively, can be achieved by adding a stop control circuit to the drive device 1 shown in FIG. 1 and so on.

When the inputting of the control pulse to the drive circuit 3 is stopped in a certain period of time while the drive circuit 3 is performing a switching operation, the operation for compensating for energy loss due to copper loss or the like in the resonant circuit (the winding circuit) by intermittent current drive performed by the primary side of the electromagnetic coupling transformer 2 is stopped. Accordingly, the input voltage decreases according to an increase in the period in which the operation is stopped. Thus, the vibration energy of the piezoelectric element PZ also decreases. That is, when the stop control is performed, the operation (associated with vibration energy or an average vibration amplitude) of the piezoelectric element PZ can be adjusted through the stopping thereof.

When the drive circuit 3 shown in FIG. 2 is configured to have an H-bridge configuration, two PMOS transistors and two NMOS transistors are combined to achieve a bridge connection. Such a circuit does not necessarily have to be a circuit in which discrete electronic components are disposed on a circuit board, and may be formed in some type of an IC.

Since current that flows through the primary winding W1 of the electromagnetic coupling transformer 2 is on the order of several tens of milliamperes, it is not necessary to increase the line diameter of the winding of the electromagnetic coupling transformer 2. Also, since the magnetic flux density in the winding core is not high, it is possible to reduce the cross section of the core.

In recent years, sheet windings in which wiring patterns are formed on films by plating or vapor deposition are also available, and such sheet windings may be stacked to form a small multi-winding transformer. Such an approach can achieve a small multi-winding transformer.

The above-described embodiments can achieve a small-size and low-power-consumption piezoelectric-element drive device that is suitable for portable equipment.

Although an example in which the drive circuit according to the embodiment of the present invention is applied to the air piezoelectric pump PZP device suitable for air-cooling has been described in the third embodiment, the present invention is not limited to air-cooling. For example, the present invention may also be applicable to a piezoelectric pump PZP device that gives a certain amount of flow to a liquid cooling medium (such as water) in a conduit. The present invention can also be applied to a dust removing device for removing dust by vibrating an image-capture device or the like or to another actuator that generates vibration.

The piezoelectric-element driving device according to the embodiments of the present invention is also applicable to a device that gives a sensation of clicking on a touch sensor of the screen of a display device, such as a liquid-crystal-display device. Furthermore, since increasing the number of secondary winding circuits of the electromagnetic coupling transformer 2 to two makes it possible to provide a reverse-phase drive output simultaneously with a same-phase drive output without increasing the number of drive circuits 3, the drive circuit according to the embodiments of the present invention is also applicable to a piezoelectric motor that performs reverse-phase driving.

It should be understood by those skilled in the art that various modifications, combinations, sub-combinations and alterations may occur depending on design requirements and other factors insofar as they are within the scope of the appended claims or the equivalents thereof.

What is claimed is:

1. A method for controlling a frequency of a drive signal for driving a piezoelectric element included in a resonant circuit so that the drive-signal frequency substantially matches a resonant frequency of the resonant circuit, the method comprising the steps of:
    changing the drive-signal frequency in a predetermined frequency range multiple times;
    detecting an impedance change in the piezoelectric element each time the drive-signal frequency is changed;
    determining the resonant frequency on a basis of a transition of values of the detection; and
    determining the drive-signal frequency so that the determined resonant frequency is obtained,
    wherein, in the resonant-frequency determining step, a difference between a maximum value and a minimum value of the detection values is determined and is compared with a predetermined reference value, and
    when the comparison shows that the difference is larger than or equal to the predetermined reference value, the resonant frequency of the piezoelectric element is determined on the basis of the transition of the detection values, and when the comparison shows that the difference is smaller than the predetermined reference value, the detection values are invalidated.

2. The method according to claim 1, wherein, in the resonant frequency determining step, the drive-signal frequency at which a minimum value of the detection values obtained by changing the drive-signal frequency in the predetermined frequency range multiple times is obtained is estimated to be the resonant frequency.

3. A method for controlling a frequency of a drive signal for driving a piezoelectric element included in a resonant circuit so that the drive-signal frequency substantially matches a resonant frequency of the resonant circuit, the method comprising the steps of:
    changing the drive-signal frequency in a predetermined frequency range multiple times;
    detecting an impedance change in the piezoelectric element each time the drive-signal frequency is changed;
    determining the resonant frequency on a basis of a transition of values of the detection; and
    determining the drive-signal frequency so that the determined resonant frequency is obtained,
    wherein, in the resonant-frequency determining step, when a minimum value of the detection values obtained by changing the drive-signal frequency in the predetermined frequency range multiple times is smaller than a predetermined threshold, a trace of the detection values is obtained by connecting adjacent ones of the detection values with a straight line or an approximation curve, and
    wherein, when the number of intersections at which the trace intersects a straight line indicating a constant level of the threshold is two, an average value of two frequencies corresponding to the two intersections is estimated to be the resonant frequency, and when the number of intersections is three or more, an average value of a lowest one and a second lowest one of three or more frequencies corresponding to the respective three or more intersections is estimated to be the resonant frequency.

4. The method according to claim 1, wherein, during the change of the drive-signal frequency, the drive signal whose frequency and amplitude vary in accordance with a control signal when the control signal is supplied to a primary side of a transformer is supplied to the piezoelectric element connected to a secondary side of the transformer, and the drive-signal frequency is changed via the control signal; and a change in a voltage level of the drive signal, the voltage level having a value corresponding to an impedance of the piezoelectric element when an amplitude of the control signal is constant, is detected.

* * * * *